(12) United States Patent
Mizuno et al.

(10) Patent No.: US 9,123,531 B2
(45) Date of Patent: Sep. 1, 2015

(54) METHOD OF MANUFACTURING SEMICONDUCTOR DEVICE, SEMICONDUCTOR DEVICE AND SUBSTRATE PROCESSING APPARATUS

(71) Applicant: HITACHI KOKUSAI ELECTRIC INC., Tokyo (JP)

(72) Inventors: Norikazu Mizuno, Toyama (JP); Tomohide Kato, Toyama (JP); Takaaki Noda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/248,961

(22) Filed: Apr. 9, 2014

(65) Prior Publication Data

US 2014/0220789 A1 Aug. 7, 2014

Related U.S. Application Data

(63) Continuation of application No. 13/293,636, filed on Nov. 10, 2011, now Pat. No. 8,847,343.

(30) Foreign Application Priority Data

Nov. 24, 2010 (JP) ................................. 2010-261571

(51) Int. Cl.
*H01L 31/0216* (2014.01)
*H01L 21/02* (2006.01)
*C23C 16/40* (2006.01)
*C23C 16/455* (2006.01)
*C23C 16/52* (2006.01)
(Continued)

(52) U.S. Cl.
CPC .......... *H01L 21/02172* (2013.01); *C23C 16/40* (2013.01); *C23C 16/45534* (2013.01); *C23C 16/45542* (2013.01); *C23C 16/45555* (2013.01); *C23C 16/45557* (2013.01); *C23C 16/52* (2013.01); *H01L 21/0223* (2013.01); *H01L 27/1462* (2013.01); *H01L 27/14627* (2013.01); *H01L 31/0216* (2013.01); *H01L 31/02161* (2013.01); *H01L 31/02327* (2013.01)

(58) Field of Classification Search
CPC ...................... H01L 21/02178; H01L 21/0228; H01L 21/28282; H01L 21/3141; H01L 21/31616; H01L 21/3185; H01L 29/513
See application file for complete search history.

(56) References Cited

U.S. PATENT DOCUMENTS 4,835,032 A * 5/1989 Arioka et al. ................. 428/143
5,683,547 A * 11/1997 Azuma et al. ................. 438/695
6,162,709 A * 12/2000 Raoux et al. .................. 438/513
(Continued)

FOREIGN PATENT DOCUMENTS

JP         2009-177079 A    8/2009
KR    10-1999-0063828       7/2001
(Continued)

*Primary Examiner* — Stephen W Smoot
*Assistant Examiner* — Edward Chin
(74) *Attorney, Agent, or Firm* — Volpe and Koenig, P.C.

(57) ABSTRACT

An oxide film capable of suppressing reflection of a lens is formed under a low temperature. A method of manufacturing a semiconductor device includes forming a metal-containing oxide film on a substrate by performing a cycle a predetermined number of times, the cycle comprising: (a) supplying a metal-containing source to the substrate; (b) supplying an oxidizing source to the substrate; and (c) supplying a catalyst to the substrate.

11 Claims, 15 Drawing Sheets

(51) Int. Cl.
*H01L 27/146* (2006.01)
*H01L 31/0232* (2014.01)

(56) References Cited

U.S. PATENT DOCUMENTS

| | | | |
|---|---|---|---|
| 6,534,395 B2 | 3/2003 | Werkhoven et al. | |
| 8,038,858 B1* | 10/2011 | Bures et al. | 204/298.14 |
| 8,373,117 B2* | 2/2013 | Badiei et al. | 250/288 |
| 2005/0145333 A1* | 7/2005 | Kannan et al. | 156/345.24 |
| 2007/0217020 A1 | 9/2007 | Li et al. | |
| 2007/0275569 A1* | 11/2007 | Moghadam et al. | 438/781 |
| 2007/0299239 A1* | 12/2007 | Weigel et al. | 528/349 |
| 2008/0096340 A1* | 4/2008 | Oh et al. | 438/201 |
| 2009/0190009 A1 | 7/2009 | Kawasaki | |
| 2009/0239085 A1* | 9/2009 | Ehara | 428/446 |
| 2013/0032873 A1* | 2/2013 | Kiyotoshi | 257/324 |
| 2013/0052529 A1* | 2/2013 | Ohkubo et al. | 429/211 |
| 2013/0284917 A1* | 10/2013 | Badiei et al. | 250/288 |

FOREIGN PATENT DOCUMENTS

| | | |
|---|---|---|
| KR | 10-0540557 B1 | 12/2005 |
| KR | 10-2008-0082361 | 11/2009 |
| KR | 10-2009-0117579 A | 11/2009 |

* cited by examiner

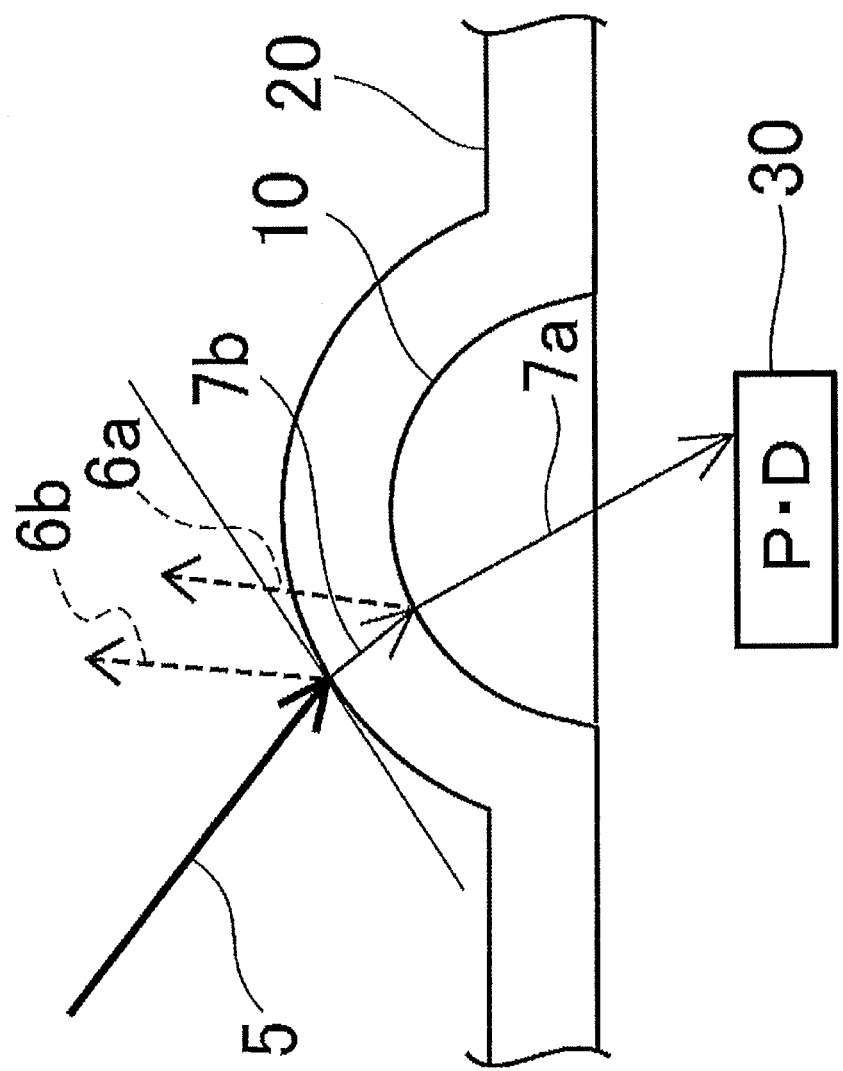

METHOD OF MANUFACTURING SEMICONDUCTOR DEVICE, SEMICONDUCTOR DEVICE AND SUBSTRATE PROCESSING APPARATUS

CROSS-REFERENCE TO RELATED PATENT APPLICATION

This application claims priority to and the benefit of Japanese Patent Applications No. 2010-261571 filed on Nov. 24, 2010 in the Japanese Patent Office, and is a continuous application of U.S. patent application Ser. No. 13/293,636 filed on Nov. 10, 2011, the entire contents of which are hereby incorporated by reference.

BACKGROUND OF THE INVENTION

1. Field of the Invention

The present invention relates to a method of manufacturing a semiconductor device, a semiconductor device, and a substrate processing apparatus.

2. Description of the Related Art

A micro lens configured to collect light for a light receiving element installed on, for example, a semiconductor device, has been used in semiconductor devices such as complementary metal oxide semiconductor (CMOS) image sensors. As the CMOS image sensor is highly integrated, light-collecting efficiency of the lens has been promoted to receive more sufficient incident light through the micro lens.

PRIOR ART DOCUMENTS

Patent Documents

1. Japanese Patent Laid-open Publication No.: 2009-177079
2. U.S. Pat. No. 6,534,395

SUMMARY OF THE INVENTION

In order to improve light-collecting efficiency of a lens, for example, reflection of incident light from a surface of the lens may be suppressed. Since the reflection is more likely to occur as a difference in refractive index between media through which light passes, i.e., air (a low refractive index) and a lens (a high refractive index), increases, the reflection can be suppressed by forming a film of a material having a refractive index therebetween, for example, an oxide film, on the lens to attenuate the difference in refractive index. Such an oxide film has been formed on, for example, a lens formed on a substrate, using a source including a predetermined element and an oxidizing agent.

However, since the refractive index is fixedly determined by a kind of the oxide film and the difference in refractive index between the media is insufficiently attenuated by only installing the oxide film having a predetermined refractive index on the lens, the reflection may be insufficiently suppressed. That is, when an oxide film having a low refractive index closer to the air is selected, reflection at an interface with the lens cannot be easily suppressed, and when an oxide film having a high refractive index closer to the lens is selected, reflection at an interface with the air cannot be easily suppressed. In addition, when the lens is formed of for example, a resin material, since a substantial reactivity between the source and the oxidizing agent cannot be obtained under a low temperature at which no thermal denaturation occurs from the resin material, the oxide film cannot be easily formed.

Therefore, an object of the present invention is to form an oxide film capable of suppressing reflection of a lens under a low temperature.

According to an aspect of the present invention, there is provided a method of manufacturing a semiconductor device, including forming a metal-containing oxide film on a substrate by performing a cycle a predetermined number of times, the cycle including: (a) supplying a metal-containing source to the substrate; (b) supplying an oxidizing source to the substrate; and (c) supplying a catalyst to the substrate.

According to another aspect of the present invention, there is provided a method of manufacturing a semiconductor device, including forming a laminated film wherein a silicon-containing oxide film and a metal-containing oxide film are alternately stacked on a substrate by alternately performing, a predetermined number of times, (a) performing a first cycle a predetermined number of times, the first cycle including: supplying a silicon-containing source to the substrate; supplying an oxidizing source to the substrate; and supplying a catalyst to the substrate to form the silicon-containing oxide film; and (b) performing a second cycle a predetermined number of times, the second cycle including: supplying a metal-containing source to the substrate; supplying an oxidizing source to the substrate; and supplying a catalyst to the substrate to form the metal-containing oxide film.

According to still another aspect of the present invention, there is provided a method of manufacturing a semiconductor device, including: (a) forming a laminated film wherein a silicon-containing oxide film and a metal-containing oxide film are alternately stacked on a substrate by alternately performing, a predetermined number of times, (a-1) performing a first cycle a predetermined number of times, the first cycle including: supplying a silicon-containing source to the substrate; supplying an oxidizing source to the substrate; and supplying a catalyst to the substrate to form the silicon-containing oxide film; and (a-2) performing a second cycle a predetermined number of times, the second cycle including: supplying a metal-containing source to the substrate; supplying an oxidizing source to the substrate; and supplying a catalyst to the substrate to form the metal-containing oxide film; and (b) forming a silicon-containing oxide film on the laminated film by performing a third cycle a predetermined number of times, the third cycle including: supplying a silicon-containing source to the substrate; supplying an oxidizing source to the substrate; and supplying a catalyst to the substrate.

According to a method of manufacturing a semiconductor device, a semiconductor device and a substrate processing apparatus of the present invention, an oxide film capable of suppressing reflection of a lens can be formed under a low temperature.

BRIEF DESCRIPTION OF THE DRAWINGS

FIGS. 11A and 11B are schematic views showing a refractive index of a lens installed on a semiconductor device in accordance with a related art example and the reference example.

DETAILED DESCRIPTION OF THE PREFERRED EMBODIMENTS

<Inventors' Comments>

First, before describing embodiments of the present invention, some comments from the inventors will be explained.

As described above, a semiconductor device such as a CMOS image sensor is manufactured by forming a light receiving element configured to convert light into an electrical signal, an interconnection configured to process the electrical signal, and so on, on a substrate. For example, a small lens (a micro lens) is installed over the light receiving element to collect light for the light receiving device.

Figure 11A:
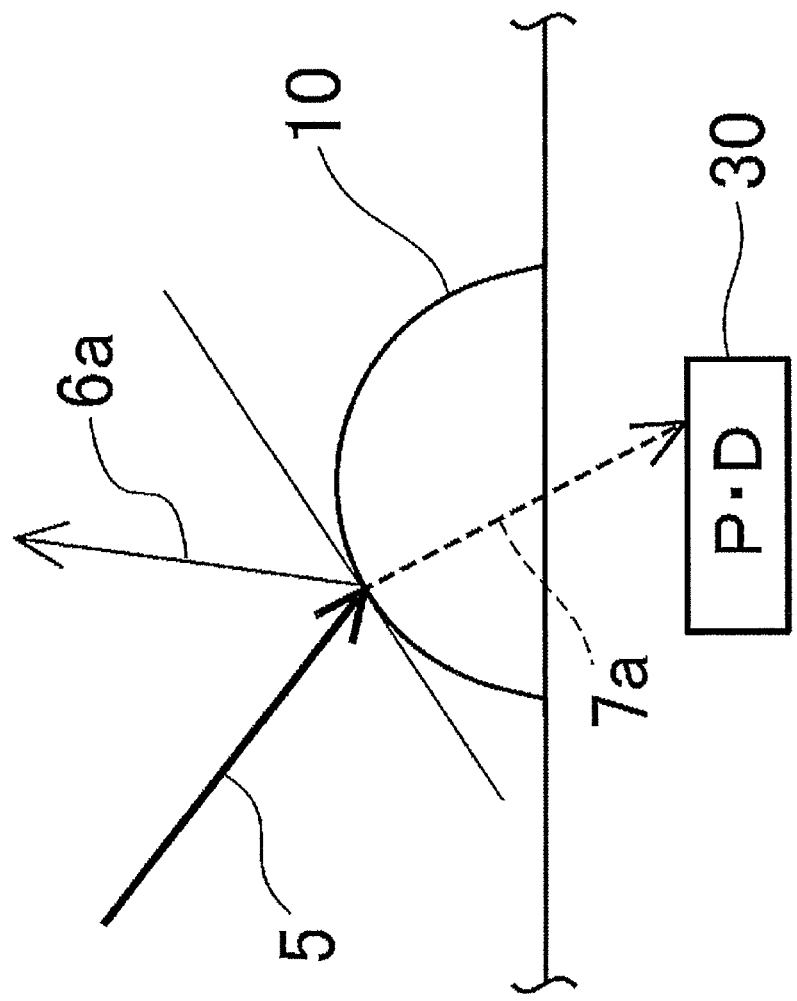

In a conventional semiconductor device shown in FIG. 11A, incident light 5 which arrives at a resist lens 10, which is a lens formed of photo resist, partially arrives at a photo diode 30, which is a light receiving element (a refractive light 7a), and is partially reflected (a reflective light 6a). Since a difference in refractive index between the air (refractive index: 1.0) and the resist lens 10 (refractive index: 1.6), through which light passes, is large, reflection can easily occur. For this reason, in the conventional semiconductor device, light-collecting efficiency of the resist lens 10 becomes insufficient, and thus, only a weak electrical signal having a large noise ratio may be obtained.

On a semiconductor device according to a reference example shown in FIG. 11B, for example, a SiO film 20 is formed on a resist lens 10 as one method of suppressing reflection. The difference in refractive index is attenuated by the SiO film 20 (refractive index: 1.45) having a refractive index between the air and the resist lens 10 to somewhat suppress the reflection (reflective light 6a and 6b) on each film surface.

However, since the refractive index of the oxide film is fixedly determined by a kind of the oxide film such as the SiO film 20, the reflection cannot be substantially suppressed by a predetermined oxide film only. While the refractive index is adjusted by appropriately selecting the kind of the oxide film to suppress the reflection at the film surface, when the oxide film having a refractive index closer to the air is formed, the reflection at a surface of the resist lens 10 cannot be easily suppressed, and when the oxide film having a refractive index closer to the resist lens 10 is formed, the reflection at an interface with the air cannot be easily suppressed.

In addition, in the semiconductor device according to the reference example, there have been problems involving a temperature upon film forming. The oxide film is formed on the lens of the substrate by supplying a source and an oxidizing source into a process chamber in which the substrate is accommodated and reacting the source and the oxidizing source. However, as described above, when the lens is formed of a resin material such as photo resist, under a temperature at which no thermal denaturation occurs from the resin material, for example, a low temperature equal to or lower than 200° C., reaction between the source and the oxidizing source cannot be sufficiently generated and the oxide film cannot be easily formed.

Therefrom, the inventors have performed research on means for solving these problems. As a result, it has been ascertained that, when an oxide film is formed, reflection can be suppressed by varying a refractive index of the oxide film in a thickness direction. In addition, it has been ascertained that the oxide film can be formed even under a low temperature by supplying catalyst or using plasma. The present invention is based on these discoveries by the inventors.

<First Embodiment>

A configuration of a substrate processing apparatus in accordance with a first embodiment of the present invention will be described below.

(1) Entire Configuration of Substrate Processing Apparatus

Figure 1:
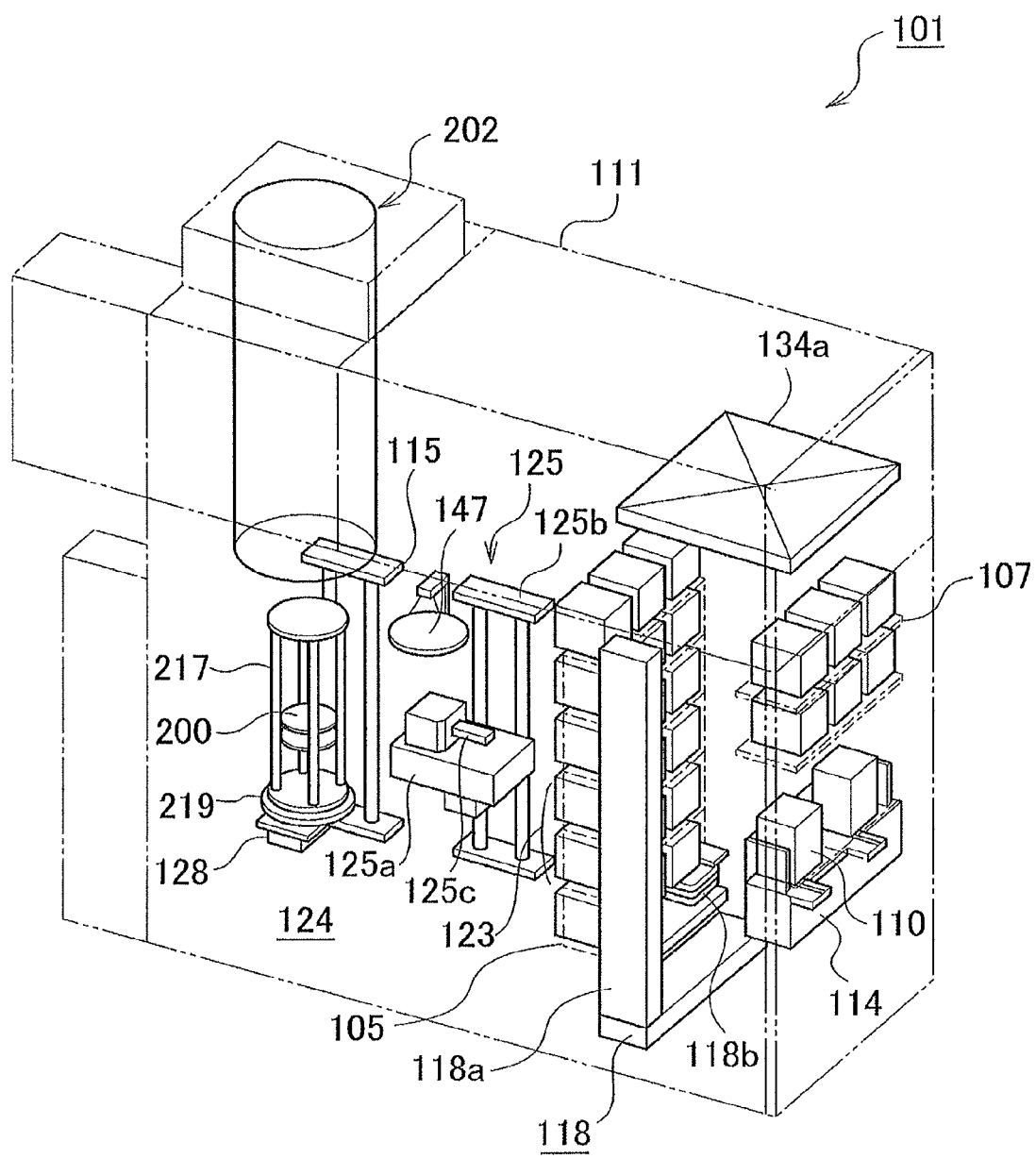
FIG. 1 is a perspective view of a substrate processing apparatus in accordance with a first embodiment of the present invention.

FIG. 1 is a perspective view of a substrate processing apparatus 101 of the embodiment.

As shown in FIG. 1, the substrate processing apparatus 101 in accordance with the embodiment includes a housing 111. In order to convey a wafer 200, which is a substrate, into/from the housing 111, a cassette 110, which is a wafer carrier (a substrate receiving vessel) configured to receive a plurality of wafers 200, is used. A cassette loading/unloading port (a substrate-receiving vessel loading/unloading port, not shown), which is an opening through the cassette 110 is conveyed into/from the housing 111, is installed in the front of the housing 111. A cassette stage 114 (a substrate-receiving vessel delivery platform) is installed inside the cassette loading/unloading port inside the housing 111. The cassette 110 is placed on the cassette stage 114 by a conveyance apparatus in a factory (not shown), is configured to be unloaded to the outside of the housing 111 from above the cassette stage 114.

The cassette 110 is configured to be placed on the cassette stage 114 by the conveyance apparatus in the factory such that the wafer 200 in the cassette 110 is in a vertical posture and a wafer entrance of the cassette 110 is directed upward. The cassette stage 114 is configured such that the cassette 110 is rotated 90° toward a rear side of the housing 111 to place the wafer 200 in the cassette 110 in a horizontal posture, and the wafer entrance of the cassette 110 is directed to the rear side in the housing 111.

A cassette shelf 105 (a substrate receiving vessel placing shelf) is installed at a substantially center portion in the housing 111 in a forward-backward direction. The cassette shelf 105 is configured to store a plurality of cassettes 110 in multiple rows and multiple columns. A transfer shelf 123, in which the cassette 110 conveyed by a wafer transfer mechanism 125 (described later) is received, is installed at the cassette shelf 105. In addition, a preliminary cassette shelf 107 is configured to be installed over the cassette 114 to store a preliminary cassette 200.

A cassette conveyance apparatus 118 (a substrate receiving vessel conveyance apparatus) is installed between the cassette stage 114 and the cassette shelf 105. The cassette conveyance apparatus 118 includes a cassette elevator 118a (a substrate receiving vessel elevation mechanism) configured to go up/down with holding the cassette 110, and a cassette conveyance mechanism 118b (a substrate receiving vessel conveyance mechanism), which is a conveyance mechanism that is horizontally movable while holding the cassette 110. With a continuous operation of the cassette elevator 118a and the cassette conveyance mechanism 118b, the cassette 110 is configured to be conveyed to a predetermined position of the cassette shelf 105 other than the cassette stage 114 and the transfer shelf 123, i.e., between the preliminary cassette shelf 107 and the transfer shelf 123.

A wafer transfer mechanism 125 (a substrate transfer mechanism) is installed behind the cassette shelf 105. The wafer transfer mechanism 125 includes a wafer transfer apparatus 125a (a substrate transfer apparatus) configured to horizontally rotate or straightly move the wafer 200, and a wafer transfer apparatus elevator 125b (a substrate transfer apparatus elevation mechanism) configured to raise/lower the wafer transfer apparatus 125a. In addition, the wafer transfer apparatus 125a includes tweezers 125c (a substrate holder) configured to hold the wafer 200 in a horizontal posture. With a continuous operation of the wafer transfer apparatus 125a and the wafer transfer apparatus elevator 125b, the wafer 200 is picked up from the cassette 110 on the transfer shelf 123 to be charged on a boat 217 (a substrate holder, described later) (wafer charging), or the wafer 200 is discharged from the boat 217 (wafer discharging), receiving the wafer 200 into the cassette 110 on the transfer shelf 123.

The process furnace 202 is installed at a rear upper side of the housing 111. An opening is formed at a lower end of the process furnace 202, and configured to be opened/closed by a furnace port shutter 147 (a furnace port opening/closing mechanism). In addition, a configuration of the process furnace 202 will be described later.

A transfer chamber 124, which is a space for charging/discharging the wafer 200 from the cassette 110 on the transfer shelf 123 to the boat 217 (the substrate holder), is installed under the process furnace 202. A boat elevator 115 (a substrate holder elevation mechanism), which is an elevation mechanism configured to raise/lower the boat 217 to load/unload the boat 217 into/from the process furnace 202, is installed in the transfer chamber 124. An arm 128, which is a connecting tool, is installed at an elevation frame of the boat elevator 115. A seal cap 219, which is a furnace port cover configured to vertically support the boat 217 and to hermetically close the lower end of the process furnace 202 when the boat 217 is raised by the boat elevator 115, is installed on the arm 128 in a horizontal posture.

The boat 217 includes a plurality of holding members, and is configured to hold a plurality of wafers 200 (for example, about 25 to 125) in a multi-stage in a state where the plurality of wafers 200 are concentrically aligned in a vertical direction and held in a horizontal posture.

A clean unit 134a including a supply fan and an anti-vibration filter is installed over the cassette shelf 105. The clean unit 134a is configured to flow clean air of a purified atmosphere into the housing 111.

In addition, a clean unit (not shown) including a supply fan for supplying clean air and an anti-vibration filter is installed at a left end of the housing 111 opposite to the wafer transfer apparatus elevator 125b and the boat elevator 115. The clean air injected from the clean unit is suctioned into an exhaust apparatus (not shown) to be exhausted to the outside of the housing 111, after flowing through the wafer transfer apparatus 125a and the boat 217.

(2) Operation of Substrate Processing Apparatus

Hereinafter, an operation of the substrate processing apparatus 101 in accordance with the embodiment will be described.

First, the cassette 110 is placed on the cassette stage 114 such that the cassette 110 is loaded through the cassette loading/unloading port (not shown) by the conveyance apparatus in the factory, the wafer is in a vertical posture, and the wafer entrance of the cassette 110 is directed upward. Then, the cassette 110 is rotated 90° toward a rear side of the housing 111 by the cassette stage 114. As a result, the wafer 200 in the cassette 110 is in a horizontal posture, and the wafer entrance of the cassette 110 is directed to a rear side in the housing 111.

Next, the cassette 110 is automatically conveyed and delivered to a designated shelf position of the cassette shelf 105 (except for the transfer shelf 123) or the preliminary cassette shelf 107 by the cassette conveyance apparatus 118, temporarily stored, and then, transferred to the transfer shelf 123 from the cassette shelf 104 or the preliminary cassette shelf 107 or directly conveyed to the transfer shelf 123.

When the cassette 110 is transferred to the transfer shelf 123, the wafer 200 is picked up from the cassette 110 through the wafer entrance by the tweezers 125c of the wafer transfer apparatus 125a to be charged to the boat 217 at a rear side of the transfer chamber 124 by a continuous operation of the wafer transfer apparatus 125a and the wafer transfer apparatus elevator 125b (wafer charging). The wafer transfer mechanism 125, which delivered the wafer 200 to the boat 217, returns to the cassette 110, and then charges the next wafer 200 to the boat 217.

When a predetermined number of wafers 200 are charged to the boat 217, the furnace port shutter 147 closing the lower end of the process furnace 202 is opened. Next, as the seal cap 219 is raised by the boat elevator 115, the boat 217 holding the group of the wafer 200 is loaded into the process furnace 202 (boat loading). After the loading, arbitrary processing is performed on the wafer 200 in the process furnace 202. Such processing will be described later. After the processing, the wafer 200 and the cassette 110 are unloaded to the outside of the housing 111 in reverse sequence of the above sequence.

(3) Configuration of Process Furnace

Figure 2:
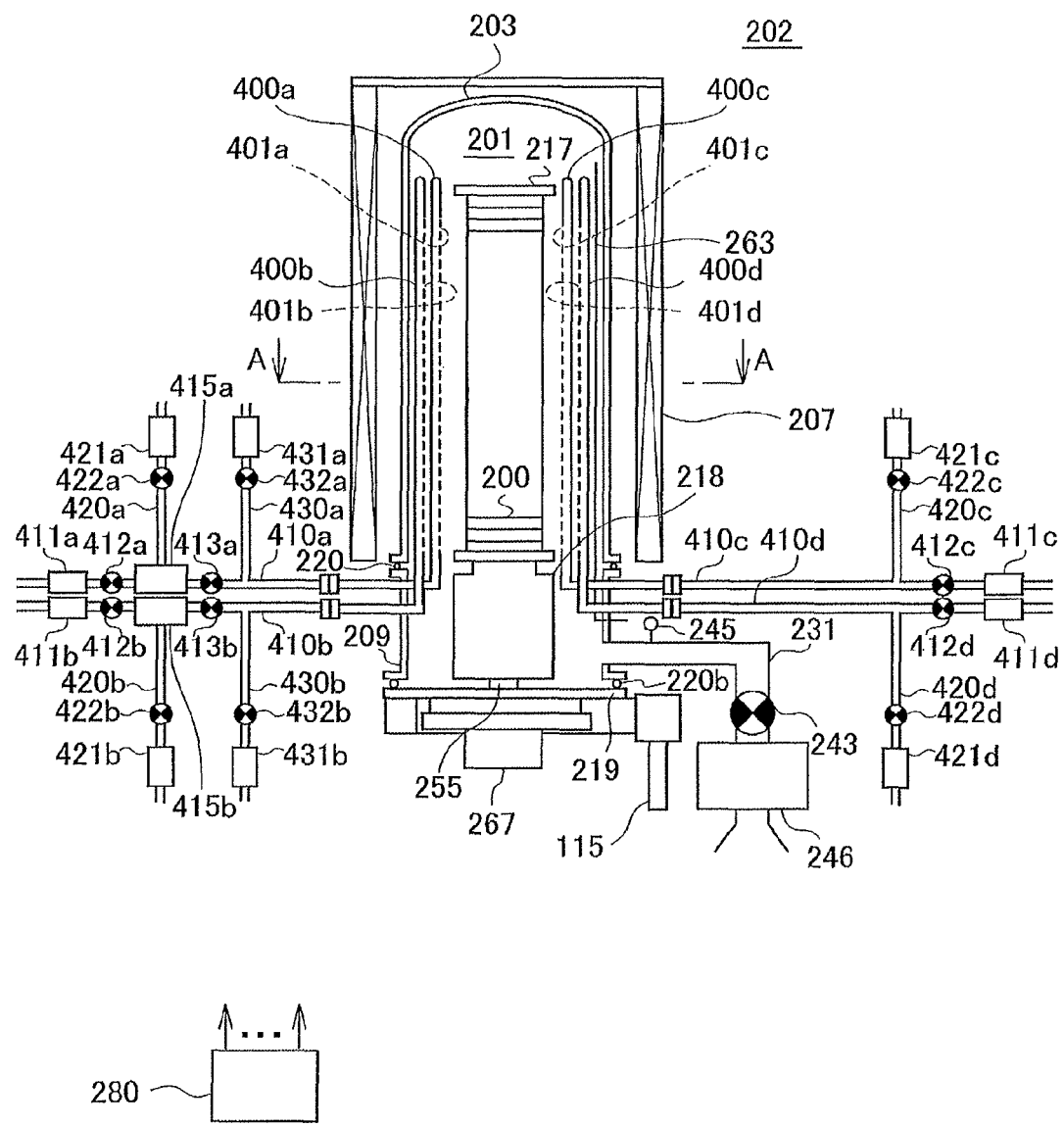
FIG. 2 is a view of a process furnace in accordance with the first embodiment of the present invention, particularly showing a cross-sectional view of a process chamber.
Figure 3:
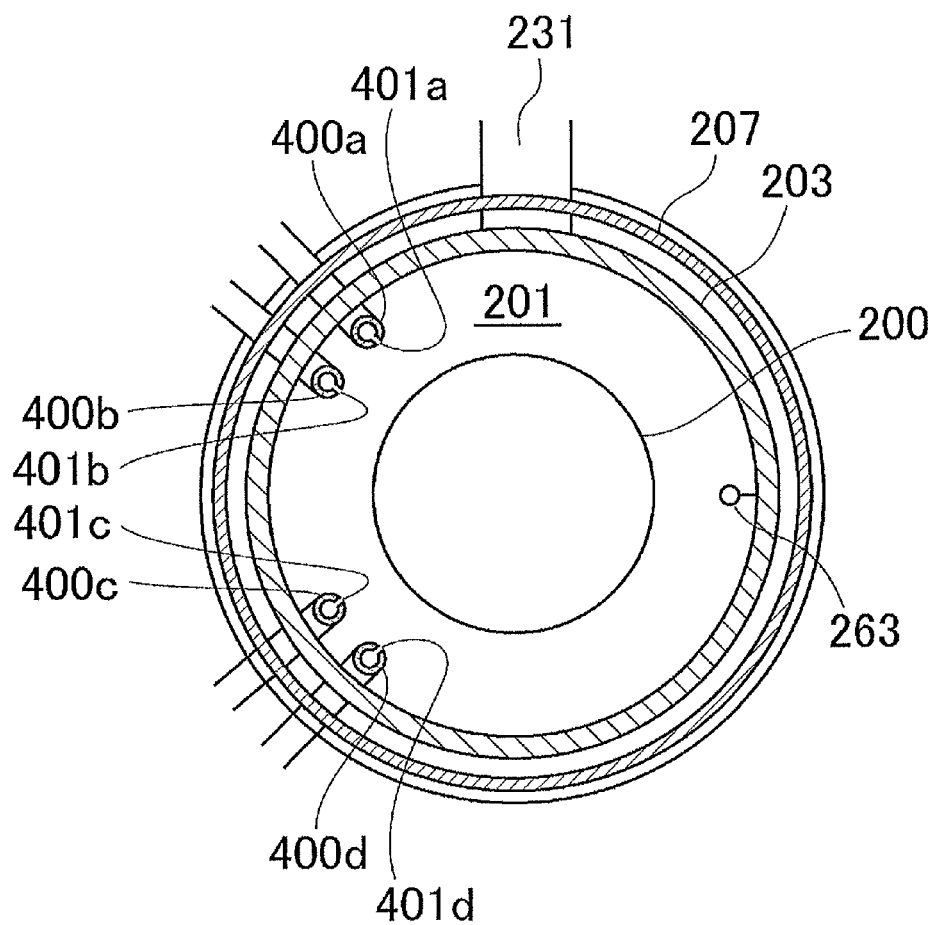
FIG. 3 is a view of the process furnace in accordance with the first embodiment of the present invention, particularly showing a cross-sectional view taken along line A-A of the process chamber of FIG. 2.

Next, a configuration of the process furnace 202 in accordance with the embodiment will be generally described with reference to FIGS. 2 and 3. FIG. 2 is a configuration view of the process furnace 202 of the substrate processing apparatus 101 shown in FIG. 1, particularly showing a cross-sectional view of a process chamber 201. In addition, FIG. 3 is a cross-sectional view taken along line A-A of the process chamber 201 shown in FIG. 2.

(Process Chamber)

The process furnace 202 in accordance with the embodiment is configured as a batch-type vertical hot-wall process furnace. The process furnace 202 includes a reaction tube 203 and a manifold 209. The reaction tube 203 is formed of a heat resistant material such as quartz ($SiO_2$) or silicon carbide (SiC), and has a cylindrical shape with an upper end closed and a lower end opened. The manifold 209 is faulted of a metal material such as SUS, and has a cylindrical shape with upper and lower ends opened. The reaction tube 203 is vertically supported from the lower end side thereof by the manifold 209. The reaction tube 203 is disposed concentrically with the manifold 209. An O-ring 220, which is a sealing member, is installed between the reaction tube 203 and the manifold 209. A lower end of the manifold 209 is configured to be hermetically sealed by the seal cap 219 when the boat elevator 115 is raised. An O-ring 220b, which is a sealing member configured to hermetically seal the inside of the process chamber 201, is installed between the lower end of the manifold 209 and the seal cap 219.

The process chamber 201 in which the wafer 200, which is a substrate, is accommodated is formed in the reaction tube 203 and the manifold 209. The boat 217, which is a substrate holder, is configured to be inserted into the process chamber 201 from a lower side thereof. Inner diameters of the reaction tube 203 and the manifold 209 are configured to be larger than a maximum outline of the boat 217 to which the wafer 200 is charged.

The boat 217 is formed of a heat resistant material such as quartz or silicon carbide, and is configured to hold the plurality of wafers 200 in a multi-stage in a state where the plurality of wafers 200 are concentrically aligned and held in a horizontal posture. In addition, an insulating member 218 formed of a heat resistant material such as quartz or silicon carbide is installed at a lower part of the boat 217 to reduce heat transfer from a heater 207 (described later) to the seal cap 219. Further, the insulating member 218 may be constituted by a plurality of insulating plates formed of a heat resistant material such as quartz or silicon carbide, and an insulating plate holder configured to support the plates in a horizontal posture in a multi-stage.

The seal cap 219, which is a furnace port cover configured to hermetically close a lower end opening of the reaction tube 203, is installed under the reaction tube 203. The seal cap 219 abuts the lower end of the reaction tube 203 from a vertical lower side thereof. The seal cap 219 is formed of a metal material such as SUS and has a disc shape. An O-ring 220b, which is a seal member in contact with the lower end of the manifold 209, is installed at an upper surface of the seal cap 219.

A rotary mechanism 267 configured to rotate the boat 217 is installed at the seal cap 219 opposite to the process chamber 201. A rotary shaft 255 of the rotary mechanism 267 is connected to the boat 217 through the seal cap 219 to rotate the boat 217, thus rotating the wafer 200. The seal cap 219 is configured to be vertically raised/lowered by the boat elevator 115, which is an elevation mechanism vertically installed outside the reaction tube 203 such that the boat 217 can be loaded/unloaded into/from the process chamber 201.

The heater 207, which is a heating unit having a cylindrical shape concentric with the reaction tube 203, is installed at an outer circumference of the reaction tube 203. The heater 207 is supported by a heater base (not shown), which is a holding plate, to be installed vertically. In addition, the heater 207 functions as an activation mechanism configured to activate a gas using heat.

A temperature sensor 263, which is a temperature detector, is installed in the reaction tube 203, and a conduction state to the heater 207 is adjusted based on temperature information detected by the temperature sensor 263 such that a temperature in the process chamber 201 becomes a desired temperature distribution. The temperature sensor 263 has an L shape similar to nozzles 400a, 400b, 400c and 400d (described later), and is installed along an inner wall of the reaction tube 203.

Mainly, the process chamber 201 is constituted by the reaction tube 203, the manifold 209 and the seal cap 219, and the process furnace 202 is constituted by the heater 207, the reaction tube 203, the manifold 209 and the seal cap 219.

(Nozzle)
A first nozzle 400a, a second nozzle 400b, a third nozzle 400c and a fourth nozzle 400d are installed at a lower portion of the reaction tube 203 in the process chamber 201 to pass through a sidewall of the manifold 209. Each of the nozzles 400a, 400b, 400c and 400d is constituted as an L-shaped long nozzle.

Specifically, the nozzles 400a, 400b, 400c and 400d are installed in a vertical posture in an arc-shaped space between the inner wall of the reaction tube 203 and the wafer 200 from a lower portion to an upper portion of the inner wall of the reaction tube 203 upward in a stacking direction of the wafers 200. Gas supply holes 401a, 401b, 401c and 401d configured to supply a gas are installed at side surfaces of the nozzles 400a, 400b, 400c and 400d, respectively. The gas supply holes 401a, 401b, 401c and 401d are opened toward a center of the reaction tube 203. The plurality of gas supply holes 401a, 401b, 401c and 401d are installed from the lower portion to the upper portion of the reaction tube 203, each of which has the same opening area at the same opening pitch.

In addition, as shown in FIG. 3, the nozzles 400a, 400b, 400c and 400d are installed at positions opposite to the temperature sensor 263, for example, with the wafer 200 interposed therebetween. However, in FIG. 2, in order to show structures of the nozzles 400a, 400b, 400c and 400d, for the sake of convenience, the third nozzle 400c and the fourth nozzle 400d and their subsidiary gas supply pipes 410c and 410d are shown at a right side of the drawing opposite to the first nozzle 400a and the second nozzle 400b.

(First Processing Source Supply Part) A downstream end of a first processing source gas supply pipe 410a configured to supply a Si-containing gas, which is a first processing source including silicon (Si) as a first element, for example, hexachlorodisilane (HCD: $Si_2Cl_6$) gas, is connected to an upstream end (a lower portion) of the first nozzle 400a. An HCD supply source (not shown) configured to supply a liquid source, which is in a liquid phase at room temperature, a liquid mass flow controller 411a, which is a flow rate controller (a flow rate control unit), a valve 412a, which is an opening/closing valve, an evaporator 415a, and a valve 413a, which is an opening/closing valve, are installed at the first processing source supply pipe 410a in a sequence from an upstream side thereof.

A downstream end of a carrier gas supply pipe 420a configured to supply a carrier gas such as nitrogen ($N_2$) gas supplied into the process chamber 201 with HCD gas generated in the evaporator 415a is connected to the evaporator 415a. A carrier gas supply source (not shown), a mass flow controller 421a, which is a flow rate controller (a flow rate control unit), and a valve 422a, which is an opening/closing valve, are installed at the carrier gas supply pipe 420a in a sequence from the upstream side thereof. When the valve 412a is opened and liquid HCD whose flow rate is controlled by a liquid mass flow controller 411a is supplied into the evaporator 415a, the evaporator 415a is configured to heat the supplied HCD to generate a vaporized gas of the HCD. From the state in which the HCD gas is generated in the evaporator 415a, the valve 422a is opened, the carrier gas whose flow rate is controlled by the mass flow controller 421a is supplied into the evaporator 415a, and the valve 413a is opened, such that the HCD gas can be supplied into the process chamber 201 with the carrier gas.

A downstream end of a purge gas supply pipe 430a configured to supply a purge gas such as $N_2$ gas is connected to the first processing source supply pipe 410a at a lower side of the valve 413a. A purge gas supply source (not shown), a mass flow controller 431a, which is a flow rate controller (a flow rate control unit), and a valve 432a, which is an opening/ closing valve, are installed at the purge gas supply pipe 430a in a sequence from the upstream side thereof. As the valve 432a is opened, the purge gas can be supplied into the process chamber 201 from the purge gas supply source while controlling a flow rate by the mass flow controller 431a. For example, after completion of supply of the HCD gas, as the purge gas is supplied while exhausting the inside of the process chamber 201, the HCD gas remaining in the process chamber 201 can be eliminated.

A first processing source supply part configured to supply a first processing source into the process chamber 201 is mainly constituted by the first processing source supply pipe 410a, the HCD supply source, the liquid mass flow controller 411a, the valve 412a, the evaporator 415a, the valve 413a, the carrier gas supply pipe 420a, the carrier gas supply source, the mass flow controller 421a, the valve 422a, the first nozzle 400a and the gas supply hole 401a.

(Second Processing Source Supply Part)

A downstream end of a second processing source supply pipe 410b configured to supply a Ti-containing gas as a second processing source including titanium (Ti) as a second element, for example, tetrachlorotitanium ($TiCl_4$) gas, is connected to an upstream end (a lower portion) of the second nozzle 400b. A $TiCl_4$ supply source (not shown) configured to supply $TiCl_4$ as a liquid source, which is liquid at room temperature, a liquid mass flow controller 411b, which is a flow rate controller (a flow rate control unit), a valve 412b, which is an opening/closing valve, an evaporator 415b, and a valve 413b, which is an opening/closing valve, are installed at the second processing source supply pipe 410b in a sequence from the upstream side thereof.

A downstream end of a carrier gas supply pipe 420b configured to supply a carrier gas such as $N_2$ gas supplied into the process chamber 201 with $TiCl_4$ gas generated in the evaporator 415b is connected to the evaporator 415b. A carrier gas supply source (not shown), a mass flow controller 421b, which is a flow rate controller (a flow rate control unit), and a valve 422b, which is an opening/closing valve, are installed at the carrier gas supply pipe 420b in sequence from the upstream side thereof. Similar to the case of the first processing source, as the respective parts are operated, the $TiCl_4$ gas generated in the evaporator 415b can be supplied into the process chamber 201 with the carrier gas.

A downstream end of a purge gas supply pipe 430b configured to supply a purge gas such as $N_2$ gas is connected to the second processing source supply pipe 410b at a downstream side of the valve 413b. A purge gas supply source (not shown), a mass flow controller 431b, which is a flow rate controller (a flow rate control unit), and a valve 432b, which is an opening/closing valve, are installed at the purge gas supply pipe 430b in a sequence from the upstream side thereof. Similar to the case of the purge gas, as the respective parts are operated, the purge gas can be supplied into the process chamber 201, and thus, the $TiCl_4$ gas remaining in the process chamber 201 can be eliminated.

A second processing source supply part configured to supply a second processing source into the process chamber 201 is mainly constituted by the second processing source supply pipe 410b, the $TiCl_4$ supply source, the liquid mass flow controller 411b, the valve 412b, the evaporator 415b, the valve 413b, the carrier gas supply pipe 420b, the carrier gas supply source, the mass flow controller 421b, the valve 422b, the second nozzle 400b and the gas supply hole 401b.

(Oxidizing Source Supply Part)

A downstream end of an oxidizing source supply pipe 410c configured to supply an oxidizing source such as an oxygen (O) containing gas, for example, vapor ($H_2O$ gas), is connected to an upstream end (a lower portion) of the third nozzle 400c.

A $H_2O$ gas supply source (not shown) configured to supply $H_2O$ gas, a mass flow controller 411c, which is a flow rate controller (a flow rate control unit), and a valve 412c, which is an opening/closing valve, are installed at the oxidizing source supply pipe 410c in a sequence from the upstream side thereof. Meanwhile, when the $H_2O$ gas is supplied, oxygen ($O_2$) gas and hydrogen ($H_2$) gas may be supplied into a pyrogenic furnace to generate $H_2O$ gas.

A downstream end of an inert gas supply pipe 420c configured to supply an inert gas such as $N_2$ gas is connected to a downstream side of the valve 412c. An inert gas supply source (not shown), a mass flow controller 421c, which is a flow rate controller (a flow rate control unit), and a valve 422c, which is an opening/closing valve, are installed at the inert gas supply pipe 420c in sequence from the upstream side thereof. As the valves 412c and 422c are opened, the $H_2O$ whose gas flow rate is controlled by the mass flow controller 412c can be supplied into the process chamber 201 with the inert gas, which is a carrier gas whose flow rate is controlled by the mass flow controller 422c.

In addition, in a state in which the valve 422c is opened with the valve 412c closed and the flow rate is controlled by the mass flow controller 421c, the inert gas is supplied into the process chamber 201 as a purge gas so that the $H_2O$ gas, etc., remaining in the process chamber 201 can be eliminated. Further, similar to the case of the first processing source and the second processing source, the purge gas supply pipe configured to supply the purge may be installed separately from the inert gas supply pipe 420c configured to supply the carrier gas.

The oxidizing source supply part configured to supply the oxidizing source into the process chamber 201 is mainly constituted by the oxidizing source supply pipe 410c, the $H_2O$ gas supply source, the mass flow controller 411c, the valve 412c, the inert gas supply pipe 420c, the inert gas supply source, the mass flow controller 421c, the valve 422c, the third nozzle 400c and the gas supply hole 401c.

(Catalyst Supply Part)

A downstream end of a catalyst supply pipe 410d configured to supply a catalyst such as ammonia ($NH_3$) gas is connected to an upstream end (a lower portion) of the fourth nozzle 400d. An $NH_3$ gas supply source (not shown) configured to supply $NH_3$ gas, a mass flow controller 411d, which is a flow rate controller (a flow rate control unit), and a valve 412d, which is an opening/closing valve, are installed at the catalyst supply pipe 410d in a sequence from the upstream side thereof.

A downstream end of an inert gas supply pipe 420d configured to supply an inert gas such as $N_2$ gas is connected to a downstream side of the valve 412d. An inert gas supply source (not shown), a mass flow controller 421d, which is a flow rate controller (a flow rate control unit), and a valve 422d, which is an opening/closing valve, are installed at the inert gas supply pipe 420d in a sequence from the upstream side thereof. Similar to the case of the oxidizing source, as the respective operations are executed, the $NH_3$ gas can be supplied into the process chamber 201 with the inert gas, which is a carrier gas.

In addition, as the inert gas is supplied into the process chamber 201 as a purge gas, the $NH_3$ gas remaining in the process chamber 201 can be eliminated. Further, similar to the case of the first processing source or the second processing source, the purge gas supply pipe configured to supply the purge gas may be installed separately from the inert gas supply pipe 420d configured to supply the carrier gas.

The catalyst supply part configured to the catalyst into the process chamber 201 is mainly constituted by the catalyst supply pipe 410d, the NH₃ gas supply source, the mass flow controller 411d, the valve 412d, the inert gas supply pipe 420d, the inert gas supply source, the mass flow controller 421d, the valve 422d, the fourth nozzle 400d and the gas supply hole 401d.

(Exhaust Part)

A gas exhaust pipe 231 configured to exhaust an atmosphere in the process chamber 201 is installed at the reaction tube 203. A vacuum pump 246, which is a vacuum exhaust apparatus, is connected to the gas exhaust pipe 231 via a pressure sensor 245, which is a pressure detector (a pressure detection part) configured to detect a pressure in the process chamber 201 and an automatic pressure controller (APC) valve 243, which is a pressure regulator (a pressure regulation part), and is configured such that the pressure in the process chamber 201 is vacuum-exhausted to a predetermined pressure (a level of vacuum). The APC valve 243 is an opening/closing valve capable of opening/closing the valve to perform vacuum exhaust/vacuum exhaust stoppage of the inside of the process chamber 201 and adjusting a valve opening angle to adjust the pressure.

In addition, as shown in FIG. 3, the gas exhaust pipe 231 is installed at, for example, a lower sidewall of the reaction tube 203 between the first nozzle 400a and the temperature sensor 263. However, in FIG. 2, in order to show structures of the gas exhaust pipe 231, the APC valve 243, the vacuum pump 246 and the pressure sensor 245, for the sake of convenience, the configuration including the gas exhaust pipe 231 is shown at a right side of the drawing opposite to the first nozzle 400a and the second nozzle 400b.

The exhaust part is mainly constituted by the gas exhaust pipe 231, the APC valve 243, the vacuum pump 246 and the pressure sensor 245.

(Control Unit)

The controller 280, which is a control unit, is connected to the liquid mass flow controllers 411a, 411b and 411c, the mass flow controllers 421a, 431a, 421b, 431b, 421c, 431c, 411d and 421d, the valves 412a, 413a, 422a, 432a, 412b, 413b, 422b, 432b, 412c, 413c, 422c, 432c, 412d and 422d, the APC valve 243, the pressure sensor 245, the vacuum pump 246, the heater 207, the temperature sensor 263, the rotary mechanism 267, the boat elevator 115, and so on. The controller 280 controls the flow rate adjusting operations of various gases by the liquid mass flow controllers 411a, 411b and 411c and the mass flow controllers 421a, 431a, 421b, 431b, 421c, 431c, 411d and 421d, the opening/closing operations of the valves 412a, 413a, 422a, 432a, 412b, 413b, 422b, 432b, 412c, 413c, 422c, 432c, 412d and 422d, the pressure regulating operations based on the opening/closing of the APC valve 243 and the pressure sensor 245, the temperature control operation of the heater 207 based on the temperature sensor 263, the start/stop of the vacuum pump 246, the rotational speed adjusting operation of the rotary mechanism 267, the elevating operation of the boat elevator 115, and so on.

(4) Substrate Processing Process

Next, the substrate processing process in accordance with the embodiment will be described. The substrate processing process in accordance with the embodiment, which is one process of a process of manufacturing a semiconductor device such as a CMOS image sensor, is performed by the process furnace 202, and similar to FIG. 10b, which will be described in detail, a silicon titanium oxide (SiTiO) film 21 having a high refractive index and a silicon oxide (SiO) film 20 having a low refractive index are sequentially formed on the resist lens 10. In addition, the SiO film is a silicon oxide film having an arbitrary composition ratio including $SiO_2$.

A film forming method includes a chemical vapor deposition (CVD) method in which a plurality of gases containing a plurality of elements constituting a film to be formed are simultaneously supplied, and an atomic layer deposition (ALD) method in which a plurality of gases containing a plurality of elements constituting a film to be formed are alternately supplied. Then, the silicon oxide (SiO) film, etc., is formed by controlling supply conditions such as a gas supply flow rate, a gas supply time, a plasma power, and so on, upon the gas supply.

In these film forming methods, for example, supply conditions are controlled such that a composition ratio of the film becomes $N/Si \approx 1.33$, which is a stoichiometric composition, when a titanium nitride (SiN) film is formed, and a composition ratio of the film becomes $O/Si \approx 2$, which is a stoichiometric composition, when a silicon oxide (SiO) film is formed.

In addition, supply conditions may be controlled such that a composition of a film to be formed becomes another predetermined composition ratio different from a stoichiometric composition. That is, the supply conditions may be controlled such that at least one element among the plurality of elements constituting the film to be formed exceeds the stoichiometric composition more than another element. As described above, the film forming may be performed while controlling a ratio of the plurality of elements constituting the film to be formed (the composition ratio of the film).

Further, the term "metal film" means a film formed of a conductive material containing metal atoms, and includes, in addition to a conductive metal mono-film formed of a metal monomer, a conductive metal nitride film, a conductive metal oxide film, a conductive metal oxynitride film, a conductive metal complex film, a conductive metal alloy film, a conductive metal silicide film, and so on. For example, the titanium nitride layer is a conductive metal nitride film.

Figure 4:
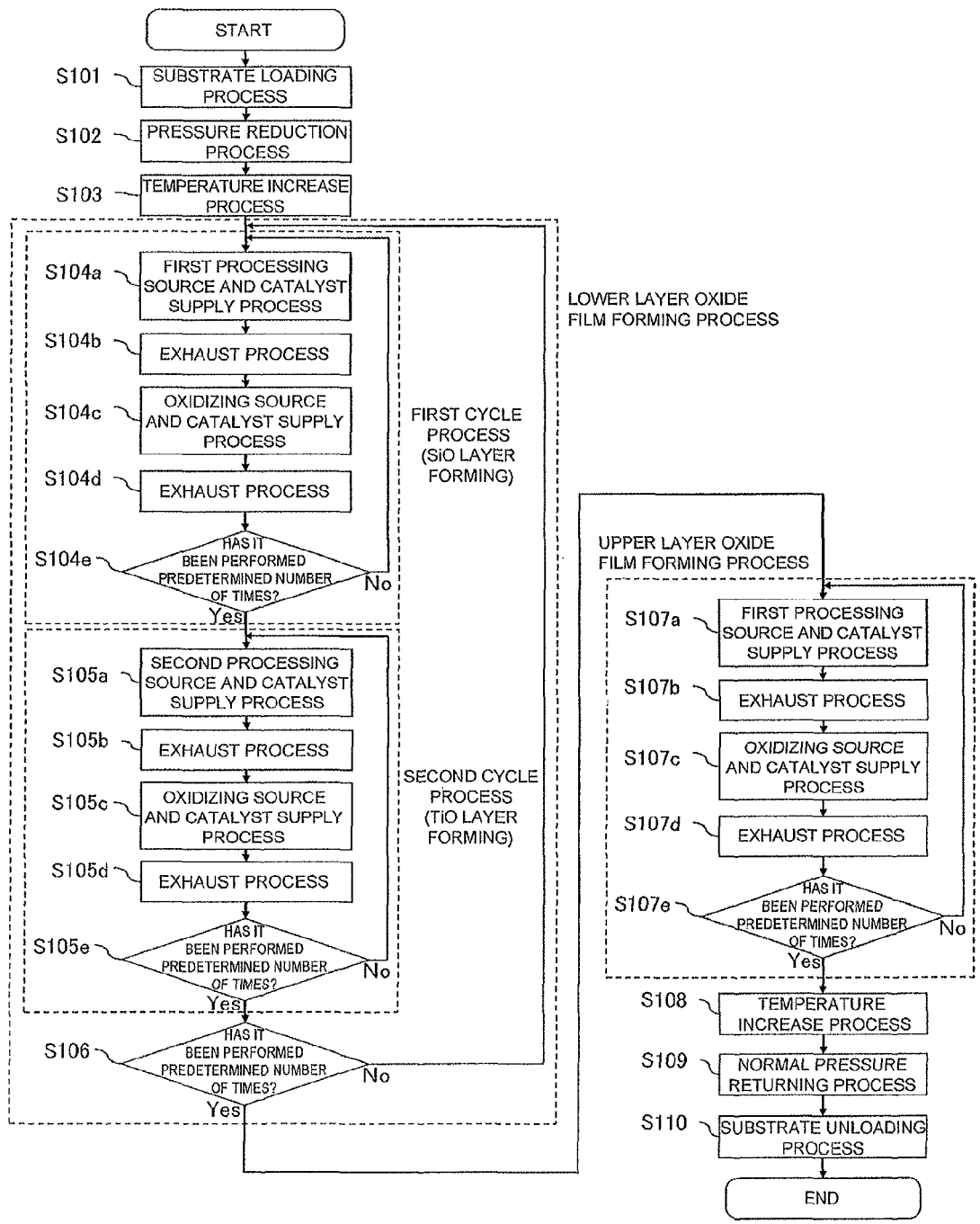
FIG. 4 is a flowchart illustrating a substrate processing process in accordance with the first embodiment of the present invention.
Figure 5:
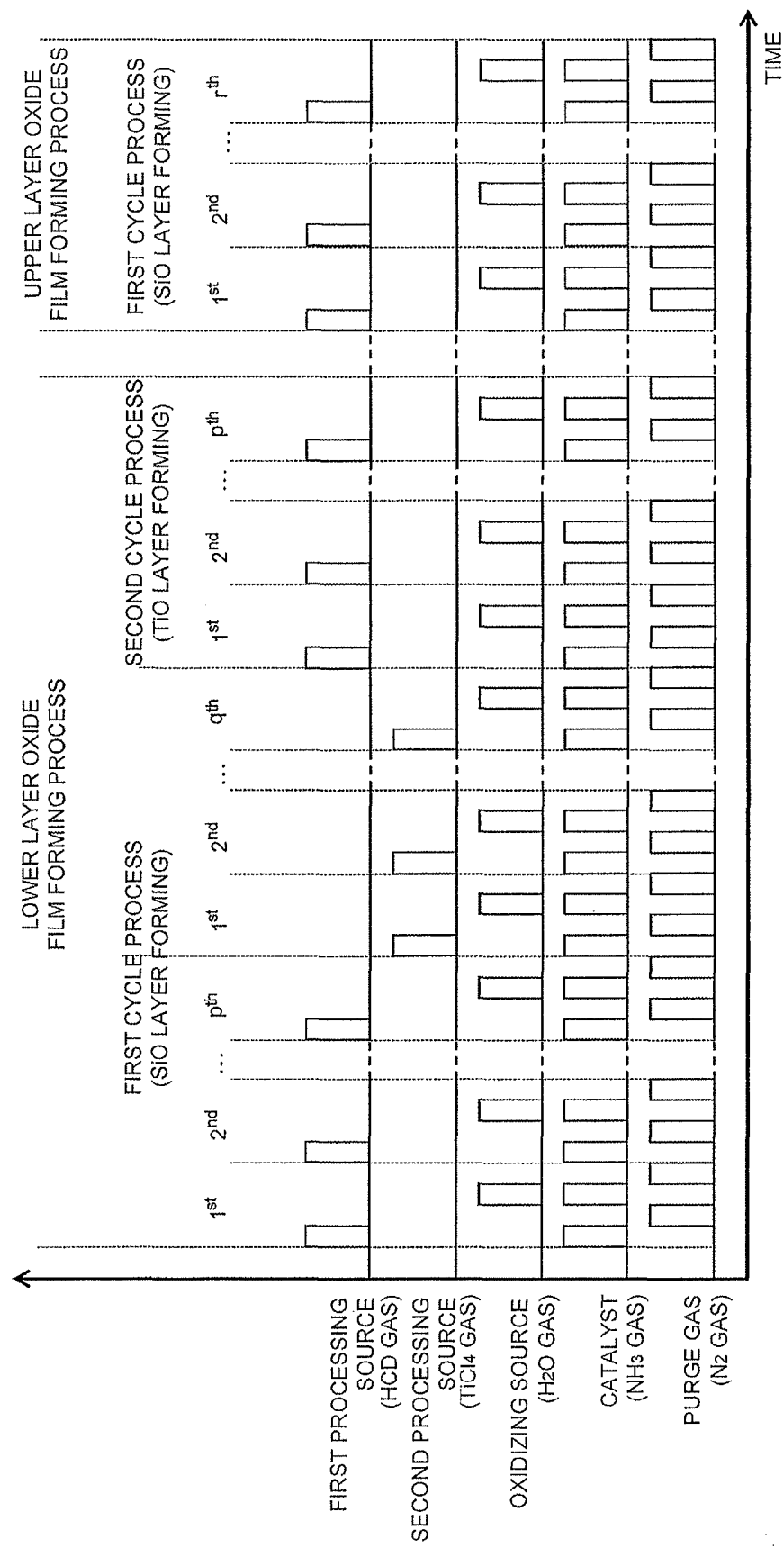
FIG. 5 is a gas supply timing chart of the substrate processing process in accordance with the first embodiment of the present invention.

Hereinafter, the substrate processing process in accordance with the embodiment will be described in detail with reference to FIGS. 4 and 5. FIG. 4 is a flowchart of the substrate processing process performed by the process furnace 202. In addition, FIG. 5 is a timing chart showing each gas supply timing when supply of the respective gases is alternately repeated according to the embodiment. In the following description, operations of the respective parts constituting the process furnace 202 shown in FIG. 2 are controlled by the controller 280.

<Substrate Loading Process S101>

First, the plurality of wafers 200 on which the resist lenses 10 are previously formed are charged to the boat 217 (wafer charging). Then, the boat 217 on which the plurality of wafers 200 are held is raised by the boat elevator 115 to be loaded into the process chamber 201 (boat loading). In this state, the seal cap 219 seals the lower end of the manifold 209 via the O-ring 220b. In the substrate loading process S101, the valves 432a and 432b of the purge gas supply pipes 430a and 430b and the valves 422c and 422d of the inert gas supply pipes 420c and 420d may be opened to continuously supply the purge gas such as N₂ gas into the process chamber 201.

<Pressure Reduction Process S102 and Temperature Increase Process S103>

Next, the valves 432a, 432b, 422c and 422d are closed, and the inside of the process chamber 201 is exhausted by the vacuum pump 246. At this time, as an opening angle of the APC valve 243 is adjusted, the inside of the process chamber 201 is under a predetermined pressure. In addition, the temperature in the process chamber 201 is controlled by the heater 207 such that the wafer 200 arrives at a desired temperature, for example, room temperature to 200° C., more preferably, room temperature to 150° C., for example, 100° C. At this time, a conduction state to the heater 207 is feedback controlled based on temperature information detected by the temperature sensor 263 such that the inside of the process chamber 201 arrives at a desired temperature distribution. Then, the boat 217 is rotated by the rotary mechanism 267 to initiate rotation of the wafer 200.

<Lower Layer Oxide Film Forming Process S104a to S106>

Figure 10A:
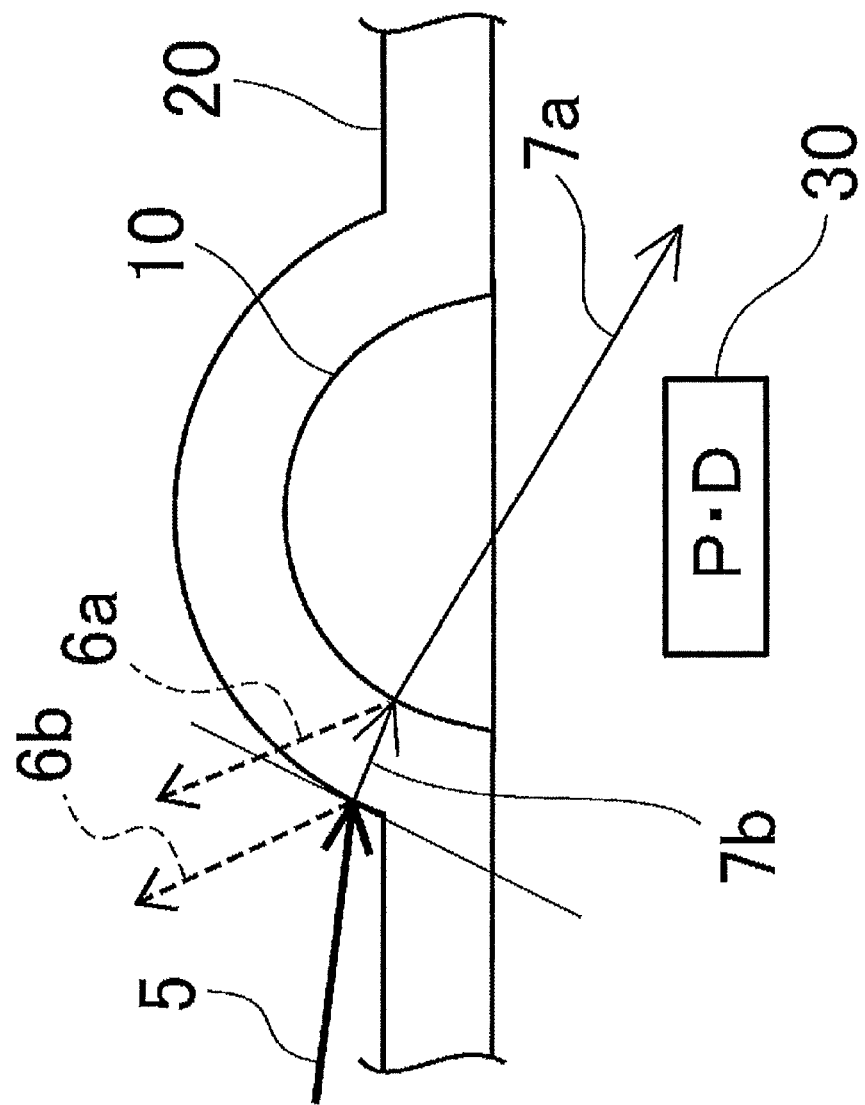
FIGS. 10A and 10B are schematic views showing a refractive index of a lens installed on a semiconductor device in accordance with a reference example and the first embodiment.
Figure 10B:
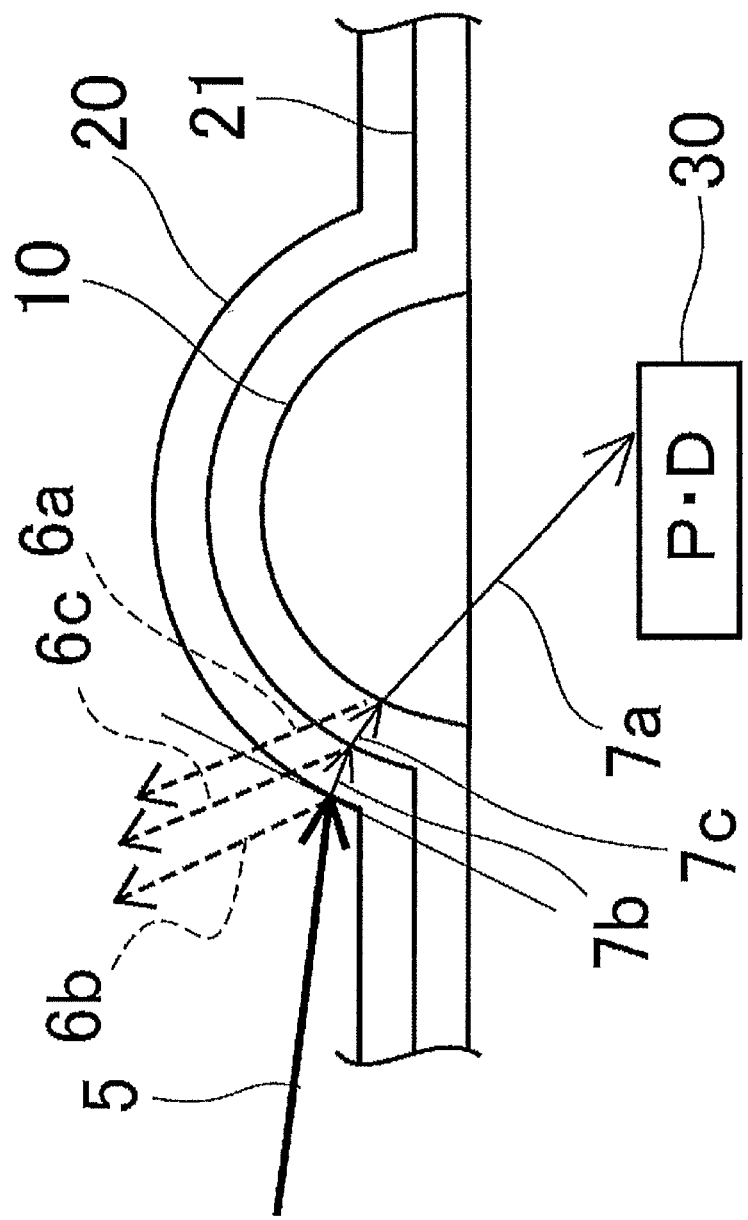

Next, processes S104a to S106 of FIG. 4 are performed to form a SiTiO film 21, which is a lower layer oxide film (a high refractive index oxide film), on the resist lens 10 formed on the wafer 200 (see FIG. 10B). The lower layer oxide film forming process S104a to S106 includes a first cycle process of setting processes S104a to S104d as one cycle and performing the cycle a predetermined number of times S104e, and a second cycle process of setting processes S105a to S105d as one cycle and performing the cycle a predetermined number of times S105e. The first cycle process S104a to S104e and the second cycle process S105a to S105e are set as one set, and the set is performed with a predetermined combination a predetermined number of times (S106), forming the SiTiO film 21. In addition, the SiTiO film 21 is a complex oxide film of Si and Ti having an arbitrary composition ratio. Hereinafter, the first cycle process S104a to S104e and the second cycle process S105a to S105e will be described in detail.

<First Processing Source and Catalyst Supply Process S104a>

In the first processing source and catalyst supply process S104a of the first cycle process S104a to S104e, HCD gas, which is a first processing source, and $NH_3$ gas, which is a catalyst, are supplied into the process chamber 201.

Specifically, first, before initiating supply of the HCD gas, the HCD gas is previously generated in the evaporator 415a. That is, the valve 412a is opened, and liquid HCD is supplied into the evaporator 415a while controlling a flow rate by the liquid mass flow controller 411a, generating the HCD gas. When the HCD gas is supplied, the valve 422a is opened, and the carrier gas is supplied into the evaporator 415a while controlling a flow rate by the mass flow controller 421a. In addition, the valve 413a is opened, and the generated HCD gas is supplied into the process chamber 201 with the carrier gas.

In addition, the valves 412d and 422d are opened, and the $NH_3$ gas is supplied into the process chamber 201 with the inert gas, which is a carrier gas, while controlling flow rates by the mass flow controllers 411d and 421d, respectively.

When the HCD gas and the $NH_3$ gas are supplied into the process chamber 201, an opening angle of the APC valve 243 is adjusted to bring the inside of the process chamber 201 to a predetermined pressure, for example, 10 Torr. A flow rate ratio of the HCD gas and the $NH_3$ gas is a ratio of a flow rate (sccm) of the HCD gas/a flow rate (sccm) of the $NH_3$ gas, for example, 0.01 to 100, more preferably 0.05 to 10. A supply time of the HCD gas and the $NH_3$ gas is, for example, 1 second to 100 seconds, more preferably, 5 seconds to 30 seconds. When a predetermined time elapses, the valves 412a, 413a, 422a and 412d are closed, and supply of the HCD gas and the $NH_3$ gas into the process chamber 201 is stopped. In addition, the valve 422d is kept open.

As described above, the HCD gas and the $NH_3$ gas supplied into the process chamber 201 pass over the wafer 200 to be exhausted through the gas exhaust pipe 231. When the HCD gas passes over the wafer 200, the HCD gas is chemisorbed to a surface of the resist lens 10 on the wafer or a surface of a Si-containing layer formed by adsorbing HCD molecule (or decomposed matters thereof) on the resist lens 10, forming the Si-containing layer.

Figure 6A:
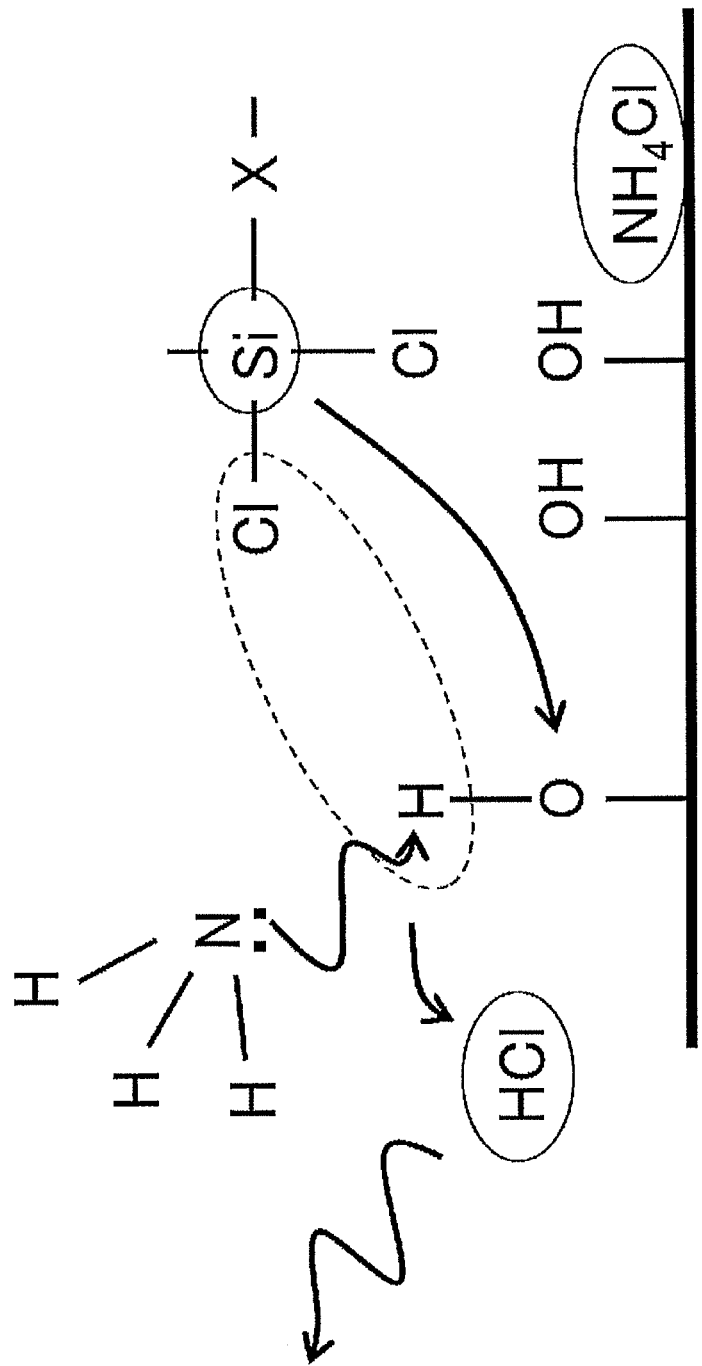
FIGS. 6A and 6B are views for explaining a catalyst reaction of the substrate processing process in accordance with the first embodiment of the present invention.

The $NH_3$ gas accelerates formation of the Si-containing layer by chemosorption of the HCD gas. That is, as shown in FIG. 6A, the $NH_3$ gas, which is a catalyst, is reacted with an OH-bond of a surface of, for example, the resist lens 10 or the Si-containing layer, weakening a bonding force between O-H. Hydrogen (H), a bonding force of which is weakened, is reacted with chlorine (Cl) of the HCD gas to separate hydrogen chloride (HCl) gas, and HCD molecules (a halide), from which Cl is lost, is chemisorbed with the surface of the resist lens 10, etc. The $NH_3$ gas weakens the bonding force between O-H because N atoms having lone electron pairs in the $NH_3$ molecules function to pull H. Since the $NH_3$ gas has an acid dissociation constant (hereinafter referred to as pKa), which is an index of a force pulling H, of about 9.2, the force pulling H is relatively strong.

<Exhaust Process S104b>

As described above, after a predetermined time has elapsed to stop supply of the HCD gas and the $NH_3$ gas, the APC valve 243 is opened to exhaust an atmosphere in the process chamber 201, eliminating the remaining HCD gas, $NH_3$ gas, decomposed matters after reaction (an exhaust gas), and so on. In addition, in a state in which the valve 422d is opened, the valve 432a is opened, and the purge gas is supplied into the process chamber 201 while controlling a flow rate by the mass flow controllers 431a and 421d. At this time, the valves 432b and 422c may be further opened, and the purge gas may be supplied through the purge gas supply pipe 430b or the inert gas supply pipe 420c. Accordingly, the effect of eliminating the remaining gas from the inside of the process chamber 201 can be further improved. After a predetermined time elapses, the valves 432a and 422d are closed and the exhaust process S104b is terminated.

<Oxidizing Source and Catalyst Supply Process S104c>

After removing the remaining gas in the process chamber 201, the $H_2O$ gas, which is an oxidizing source, and the $NH_3$ gas, which is a catalyst, are supplied into the process chamber 201. That is, the valves 412c and 422c are opened, and the $H_2O$ gas is supplied into the process chamber with the inert gas, which is a carrier gas, while controlling flow rates by the mass flow controllers 411c and 421c. In addition, in the same sequence as the first processing source and catalyst supply process S104a, the $NH_3$ gas is supplied into the process chamber 201 with the inert gas, which is a carrier gas.

When the $H_2O$ gas and the $NH_3$ gas are supplied into the process chamber 201, the pressure in the process chamber 201 is, for example, 10 Torr. In addition, for example, a ratio of a flow rate (sccm) of the $H_2O$ gas/a flow rate (sccm) of the $NH_3$ gas is 0.01 to 100, more preferably, 0.05 to 10. At this time, it is more preferable that mass percent concentrations of the $H_2O$ gas and the $NH_3$ gas are substantially equal to each other. The supply time of the gases may be, for example, 1 second to 100 seconds, more preferably, 5 seconds to 30 seconds. When a predetermined time elapses, the valves 412c and 412d are closed, and supply of the $H_2O$ gas and the $NH_3$ gas into the process chamber 201 is stopped. In addition, the valves 422c and 422d are kept open.

As described above, the $H_2O$ gas and the $NH_3$ gas supplied into the process chamber 201 pass over the wafer 200 to be exhausted through the gas exhaust pipe 231. When passing over the wafer 200, the $H_2O$ gas surface-reacts with the Si-containing layer, etc., formed on the resist lens 10, and the Si-containing layer, etc., is oxidized to be converted into a SiO layer. In addition, the SiO layer is a silicon oxide layer having an arbitrary composition ratio including $SiO_2$.

Figure 6B:
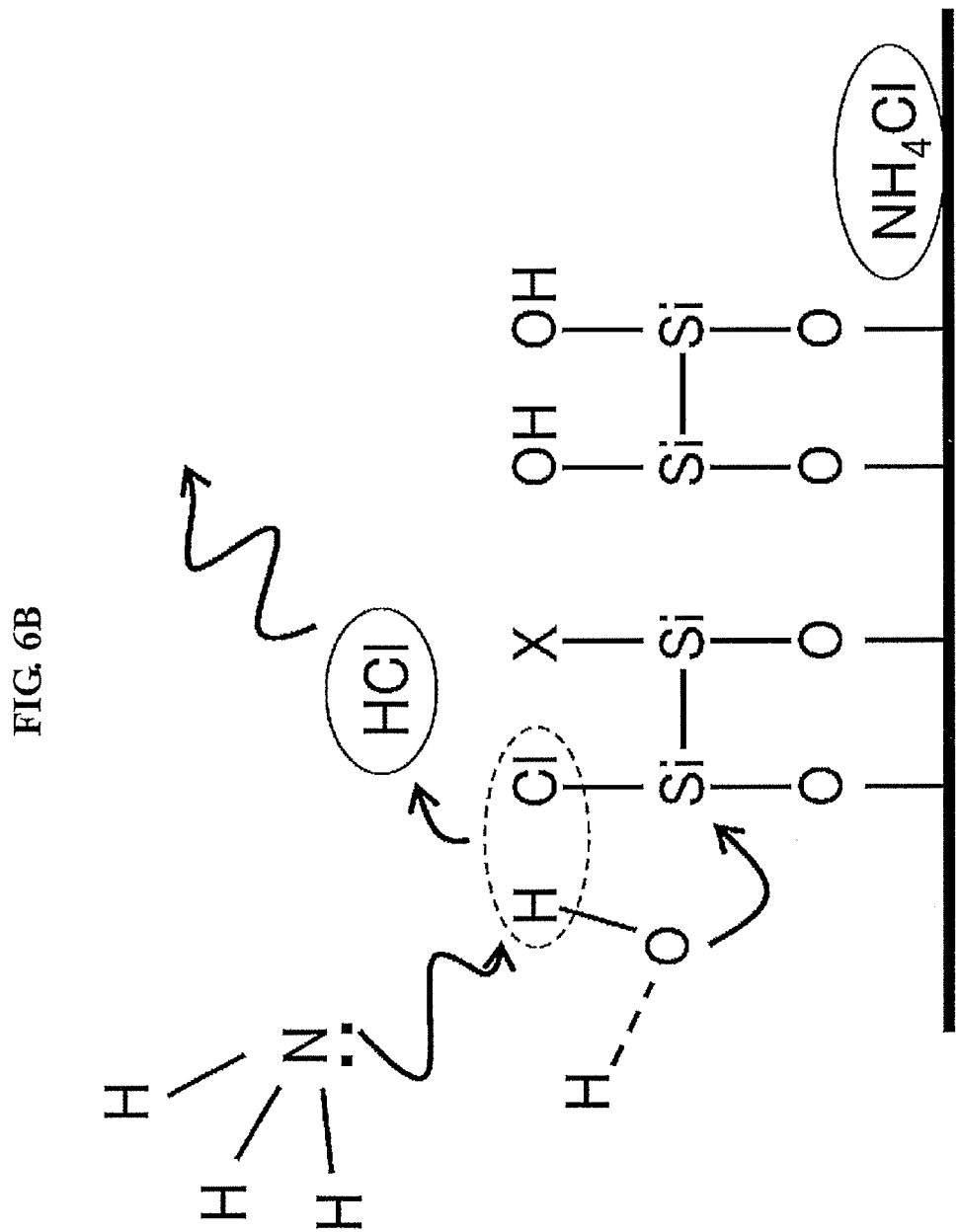

The $NH_3$ gas accelerates the surface reaction of the $H_2O$ gas with the Si-containing layer. That is, as shown in FIG. 6B, the $NH_3$ gas, which is a catalyst, reacts with an O—H bond included in the $H_2O$ gas to weaken the bonding force between O—H. H, a bonding force of which is weakened, reacts with Cl included in the Si-containing layer on the resist lens 10 to separate hydrogen chloride (HCl) gas, and O of the $H_2O$ gas, from which H is lost, is added to Si, from which Cl is separated.

<Exhaust Process S104d>

After stopping supply of the $H_2O$ gas and the $NH_3$ gas, the APC valve 243 is opened to exhaust the atmosphere in the process chamber 201, and the remaining $H_2O$ gas, $NH_3$ gas, decomposed matters after reaction (exhaust gas), etc., are eliminated. In addition, the inert gas, which is a purge gas, is supplied into the process chamber 201 while controlling flow rates by the mass flow controllers 421c and 421d via the valves 422c and 422d in an open state. At this time, another purge gas supply pipe may be used. After a predetermined time elapses, the valves 422c and 422d are closed to stop the exhaust process S104d.

<Process of Performing Predetermined Number of Times S104e>

The processes S104a to S104d are set as one cycle and the cycle is performed a predetermined number of times, forming the SiO layer on the resist lens 10 of the wafer 200 to a predetermined film thickness, for example, 2.0 Å to 10,000 Å. FIG. 5 shows an example in which the cycle is performed p times. A horizontal axis of FIG. 5 represents elapsed time, and a vertical axis of FIG. 5 represents a gas supply timing of each gas. From the above, the first cycle process S104a to S104e is terminated.

As described above, in each of the first processing source and catalyst supply process S104a and the oxidizing source and catalyst supply process S104c, since the $NH_3$ gas is used as a catalyst, chemisorption of the HCD gas can be accelerated even under a low temperature, and surface reaction of the $H_2O$ gas can also be accelerated. As described above, as the SiO layer is formed under a low temperature, thermal denaturation of the resist lens 20 can be suppressed and occurrence of bad resist lenses 10 can be reduced.

<Second Processing Source and Catalyst Supply Process S105a>

In the second processing source and catalyst supply process S105a of the second cycle process S105a to S105e, $TiCl_4$ gas, which is a second processing source, and $NH_3$ gas, which is a catalyst, are supplied into the process chamber 201.

Specifically, first, before initiating supply of the $TiCl_4$ gas, the $TiCl_4$ gas is previously generated in the evaporator 415b. That is, the valve 412b is opened, and liquid $TiCl_4$ is supplied into the evaporator 415b to generate the $TiCl_4$ gas while controlling a flow rate of the liquid mass flow controller 411b. When the $TiCl_4$ gas is supplied, the valve 422b is opened, and the carrier gas is supplied into the evaporator 415b while controlling a flow rate by the mass flow controller 421b. In addition, the valve 413b is opened, and the generated $TiCl_4$ gas is supplied into the process chamber 201 with the carrier gas. Further, in a sequence similar to the first processing source and catalyst supply process S104a, the $NH_3$ gas is supplied into the process chamber 201 with the inert gas, which is a carrier gas.

The pressure, supply amount and supply time of the gas, etc., when the $TiCl_4$ gas and the $NH_3$ gas are supplied into the process chamber 201 may be the same as in the first processing source and catalyst supply process S104a. When a predetermined time elapses, the valves 412b, 413b, 422b and 412d are closed, and supply of the $TiCl_4$ gas and the $NH_3$ gas into the process chamber 201 is stopped. In addition, the valve 422d is kept open.

Similar to the first processing source and catalyst supply process S104a, chemisorption of the $TiCl_4$ gas is accelerated by the $NH_3$ gas, and a Ti-containing layer is formed on a surface of the SiO layer, a surface of the already formed Ti-containing layer, etc.

<Exhaust Process S105b>

After stopping supply of the $TiCl_4$ gas and the $NH_3$ gas, the APC valve 243 is opened to exhaust the atmosphere in the process chamber 201 and the remaining $TiCl_4$ gas or $NH_3$ gas, decomposed matters after reaction (exhaust gas), etc., are eliminated. In addition, the valve 432 is further opened in a state in which the valve 422d is opened, and the purge gas is supplied into the process chamber 201 while controlling a flow rate by the mass flow controller 431b and 421d. At this time, another purge gas supply pipe, etc., may be used. After a predetermined time elapses, the valves 432b and 422d are closed to stop the exhaust process S105b.

<Oxidizing Source and Catalyst Supply Process S105c>

In a sequence and processing conditions similar to the oxidizing source and catalyst supply process S104c, the $H_2O$ gas and the $NH_3$ gas are supplied into the process chamber 201. The Ti-containing layer, etc., is oxidized by a reaction similar to the oxidizing source and catalyst supply process S104c to be converted into a TiO layer. In addition, the TiO layer is a titanium oxide layer, which is a metal oxide layer, having an arbitrary composition ratio including $TiO_2$.

<Exhaust Process S105d>

In a sequence similar to the exhaust process S104d, the atmosphere in the process chamber 201 is exhausted to eliminate the remaining $H_2O$ gas, etc. In addition, the purge gas is supplied into the process chamber 201.

<Process S105e of Performing Predetermined Number of Times>

The processes S105a to S105d are set as one cycle and the cycle is performed a predetermined number of times. The TiO layer is formed on the SiO layer of the wafer 200 to a predetermined film thickness, for example, 2.0 Å to 10,000 Å. FIG. 5 shows an example in which the cycle is performed q times. From the above, the second cycle process S105a to S105e is terminated.

As described above, even when the TiO layer is formed using the $TiCl_4$ gas, the $NH_3$ gas may be used as a catalyst in each of the second processing source and catalyst supply process S105a and the oxidizing source and catalyst supply process S105c, accelerating chemisorption of the $TiCl_4$ gas even under a low temperature and also accelerating surface reaction of the $H_2O$ gas. As described above, when the TiO layer is formed under a low temperature, thermal denaturation of the resist lens 10 can be suppressed to reduce occurrence of a bad resist lens 10.

<Process S106 Performed Predetermined Number of Times>

In the process S106 performed a predetermined number of times, the first cycle process S104a to S104e and the second cycle process S105a to S105e are set as one set, and the set is performed with a predetermined combination a predetermined number of times (for example, p times and q times, respectively), forming the SiTiO film 21 on the resist lens 10 of the wafer 200 to a predetermined film thickness, for example, 50 Å to 20,000 Å (see FIG. 10B).

Since a refractive index of the TiO layer is 2.2, which is relatively higher than 1.45—a refractive index of the SiO—as described above, the SiTiO film 21 formed by depositing the SiO layer and the TiO layer can obtain a high refractive index closer to the resist lens 10 than in the SiO film formed on its own. In addition, the SiTiO film 21 having a predetermined refractive index may be formed by arbitrarily adjusting a deposition ratio of the TiO layer with respect to the SiO layer. The deposition ratio may be adjusted by the combination, i.e., the number of times each cycle process is performed. For example, when the number of times the first cycle process S104a to S104e is performed is 3 (p=3) and the number of times of the second cycle process S105a to S105e is performed is 2 (q=2), the SiTiO film 21 having a refractive index of 1.55 can be obtained. In addition, when p=3 and q=1, the refractive index becomes 1.50. The refractive index of the SiTiO film 21 is selected within a range of more than a refractive index of air to less than a refractive index of the resist lens 10.

In addition, in a state in which the arbitrary combination is maintained, as the first cycle process S104a to S104e and the second cycle process S105a to S105e are set as one set and the number of times the set is performed is varied, the film thickness of the SiTiO film 21 can be controlled in a state in which a predetermined refractive index is maintained. Further, the first cycle process S104a to S104e and the second cycle process S105a to S105e may be performed in an arbitrary sequence, and the lower layer oxide film forming process S104a to S106 may be initiated from an arbitrary process or may be terminated at an arbitrary process. For example, the lower layer oxide film forming process S104a to S106 may be initiated from the second cycle process S105a to S105e and may be terminated at the second cycle process S105a to S105e.

<Upper Layer Oxide Film Forming Process S107a to S107e>

Next, the processes S107a to S107d are set as one cycle and the cycle is performed a predetermined number of times S107e, forming the SiO film 20 on the SiTiO film 21 of the wafer 200 as an upper layer oxide film (a low refractive index oxide film) (see FIG. 10B). Each process of the processes S107a to S107d is performed in a sequence and processing conditions similar to each process of the processes S104a to S104d. Since these processes are performed a predetermined number of times, the SiO film 20 is formed on the SiTiO film 21 to a predetermined film thickness, for example, 50 Å to 10,000 Å. At this time, the refractive index of the SiO film 20 is within a range of more than the refractive index of air to less than the refractive index of the SiTiO film 21. FIG. 5 shows an example in which the cycle is performed r times.

As described above, in this embodiment, the SiO film 20 having a relatively low refractive index is formed on the SiTiO film 21 having a relatively high refractive index to gradually reduce the refractive index in a thickness direction from the resist lens 10 to the air. Accordingly, in comparison with the case of forming only the SiO film 20, a difference in refractive index between the media can be further attenuated to further suppress the reflection.

<Temperature Reduction Process S108 and Normal Pressure Returning Process S109>

When the SiTiO film 21 and the SiO film 20 are formed to a desired film thickness, power supply to the heater 207 is stopped, and the boat 217 and the wafer 200 are cooled to a predetermined temperature. While reducing the temperature, the valves 432a, 432b, 422c and 422d are kept open, and supply of the purge gas into the process chamber 201 from the purge gas supply source (not shown) is continued. Accordingly, the inside of the process chamber 201 is substituted by the purge gas, and the pressure in the process chamber 201 returns to a normal pressure.

<Substrate Unloading Process S110>

When the wafer 200 is cooled to a predetermined temperature and the inside of the process chamber 201 returns to a normal pressure, in reverse sequence of the above sequence, the film-formed wafer 200 is unloaded from the process chamber 201. In addition, when the boat 217 is unloaded, the valves 432a, 432b, 422c and 422d are opened, and the purge gas may be continuously supplied into the process chamber 201. Therefore, the substrate processing apparatus in accordance with the embodiment is terminated.

(5) Effects According to the Embodiment

According to the embodiment, the following one or more effects are provided.

(a) According to the embodiment, the SiTiO film 21 and the SiO film 20 are formed on the resist lens 20 formed on the wafer 200 in sequence. At this time, the refractive index of the SiTiO film 21 is controlled within a range of more than the refractive index of air to less than the refractive index of the resist lens 10, and the refractive index of the SiO film 20 is within a range of more than the refractive index of air to less than the refractive index of the SiTiO film 21.

As described above, as the refractive index can be varied when the oxide film is formed and the refractive index is gradually reduced in a thickness direction from the resist lens 10 to the air, a difference in refractive index between the media can be attenuated to suppress reflection of the resist lens 10, improving light-collecting efficiency. FIG. 10B shows a shape in which the refractive index is attenuated to suppress reflection (reflective light 6a, 6b and 6c) of surfaces of the respective films.

(b) In addition, according to the embodiment, the SiO film 20 is combined with the SiTiO film 21 having a relatively high refractive index. Accordingly, in comparison with the case in which only the SiO film 20 having a relatively low refractive index is formed, since light can easily enter the photo diode 30 even when the light enters in a side direction, light collection from a wider angle becomes possible.

In a semiconductor device according to reference example, on which only the SiO film 20 is formed, as show in FIG. 10A, since the refractive index of the SiO film 20 is low, light collection from the wide angle may become difficult. That is, since refraction of incident light 2 in the SiO film 20 is shallow (refractive light 7b), the light is deviated from the photo diode 30 as much as the light enters in a side direction.

However, in this embodiment, since the SiTiO film 21 having a relatively high refractive index is combined with the SiO film 20, as shown in FIG. 10B, the incident light 5 can reach the photo diode 30 from a wider angle (refractive light 7a), improving light collecting efficiency.

(c) In addition, according to the embodiment, the first cycle S104a to S104e and the second cycle S105a to S105e are set as one set and the set is performed with a predetermined combination a predetermined number of times (S106), forming the SiTiO film 21. Accordingly, a deposition ratio of the TiO layer with respect to the SiO layer can be adjusted to obtain the SiTiO film 21 having a predetermined refractive ratio.

(d) Further, according to the embodiment, since the first cycle S104a to S104e and the second cycle S105a to S105e are set as one set and the number of times the set is performed is varied, the film thickness of the SiTiO film 21 can be controlled. At this time, when the predetermined combination is maintained, the refractive index of the SiTiO film 21 can be maintained at a predetermined value.

(e) Furthermore, according to the embodiment, the SiTiO film 21 and the SiO film 20 are formed using the NH$_3$ gas, which is a catalyst. In addition, at this time, the heating temperature of the wafer 200 is 200° C. or less, more preferably, 150° C. or less. Using the catalyst, even under the low temperature, chemisorption of the HCD gas and the TiCl₄ gas can be accelerated and surface reaction of the H₂O gas can also be accelerated. That is, since only the oxide film such as the SiTiO film 21 and the SiO film 20 are mainly formed, the film can be formed using the catalyst under the low temperature. Accordingly, thermal denaturation of the resist lens 10 can be suppressed and occurrence of a bad resist lens 10 can be reduced, improving properties thereof (f) Further, according to the embodiment, the SiTiO film 21 and the SiO film 20 are continuously formed in the same process chamber 201. Accordingly, efforts such as conveyance of the wafer 200 to another process furnace in the middle of the process can be omitted. In addition, since no wafer 200 is exposed to the air in the middle of the process, an oxide film of a better quality can be formed.

Furthermore, in this embodiment, while the example in which the NH₃ gas is used as a catalyst is described, the catalyst is not limited to ammonia but may be another material such as pyridine.

<Second Embodiment>

Hereinafter, a substrate processing process in accordance with a second embodiment will be described. Unlike the embodiment in which the refractive index is gradually varied in two steps, in the substrate processing process in accordance with the embodiment, a SiTiO film is formed such that a refractive index is gradually reduced in a thickness direction from a surface thereof in contact with a resist lens 10 to an opposite surface in contact with air, not forming a SiO film 20. In addition, in this embodiment, an example in which pyridine ($C_5H_5N$) gas is used as a catalyst will be described.

(1) Substrate Processing Process

Hereinafter, the substrate processing process in accordance with the embodiment will be described in detail with reference to FIGS. 7 and 8 in detail. The substrate processing process in accordance with the embodiment is also performed using the process furnace 202 of FIGS. 2 and 3, and operation of the respective parts is controlled by the controller 280. However, since the pyridine is in a liquid phase at room temperature, an apparatus of the embodiment includes a catalyst supply pipe 410d, an evaporator (not shown), and so on.

<Substrate Loading Process S201 to Temperature Increase Process S203>

Figure 7:
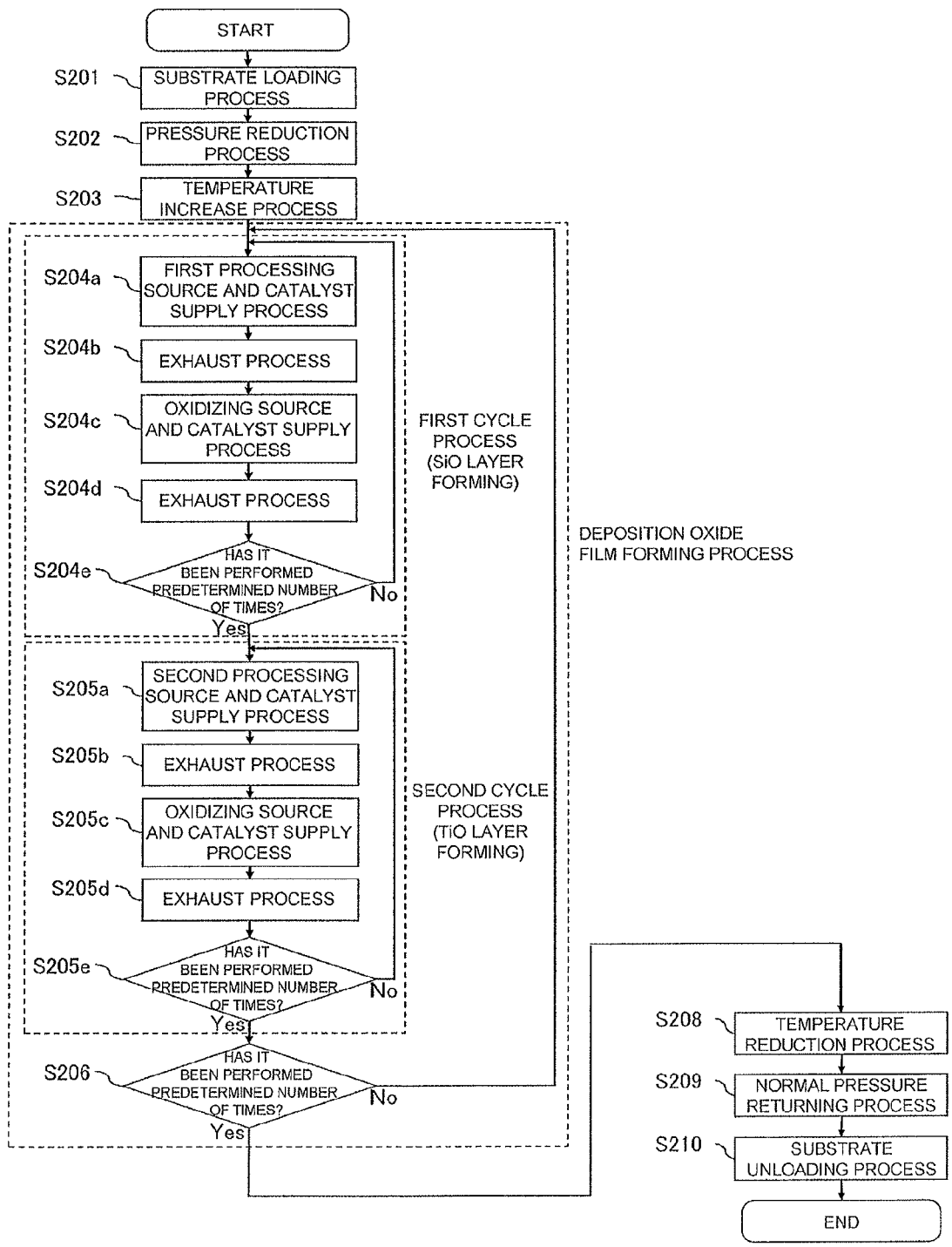
FIG. 7 is a flowchart illustrating a substrate processing process in accordance with a second embodiment of the present invention.
Figure 8:
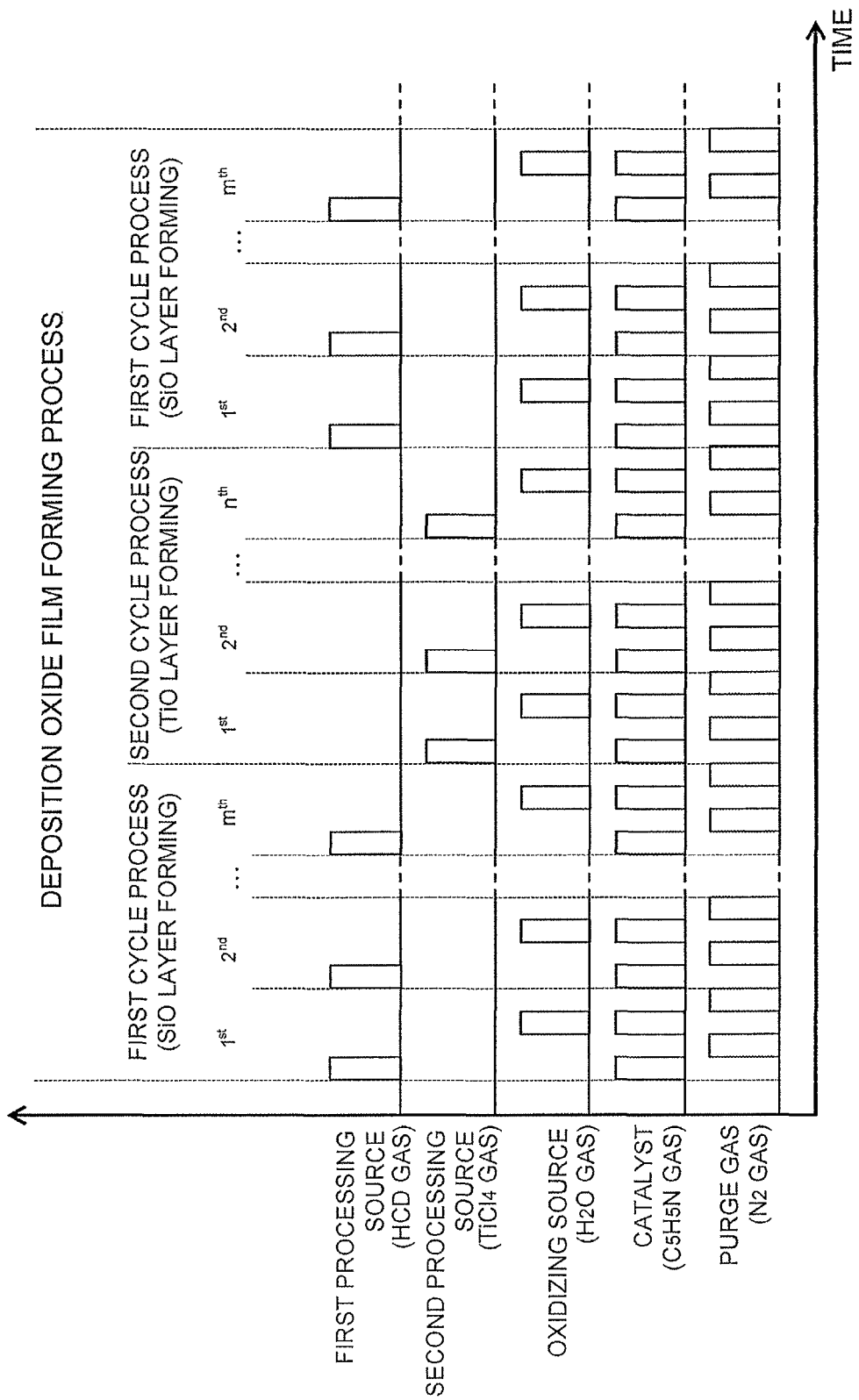
FIG. 8 is a gas supply timing chart of the substrate processing process in accordance with the second embodiment of the present invention.

A substrate loading process S201, a pressure reduction process S202 and a temperature increase process S203 shown in FIG. 7 are performed in the same sequence as the corresponding processes S101 to S103 of the above embodiment.

<Deposition Oxide Film Forming Process S204a to S206>

Next, processes S204a to S206 of FIG. 7 are performed to form a SiTiO film, which is a deposition oxide film, on a resist lens 10 formed on the wafer 200. In the deposition oxide film forming process S204a to S206, a first cycle process S204a to S204e and a second cycle process S205a to S205e are set as one set and the set is performed with a predetermined combination a predetermined number of times (S206), forming the SiTiO film.

<First Cycle Process S204a to S204e>

Figure 9A:
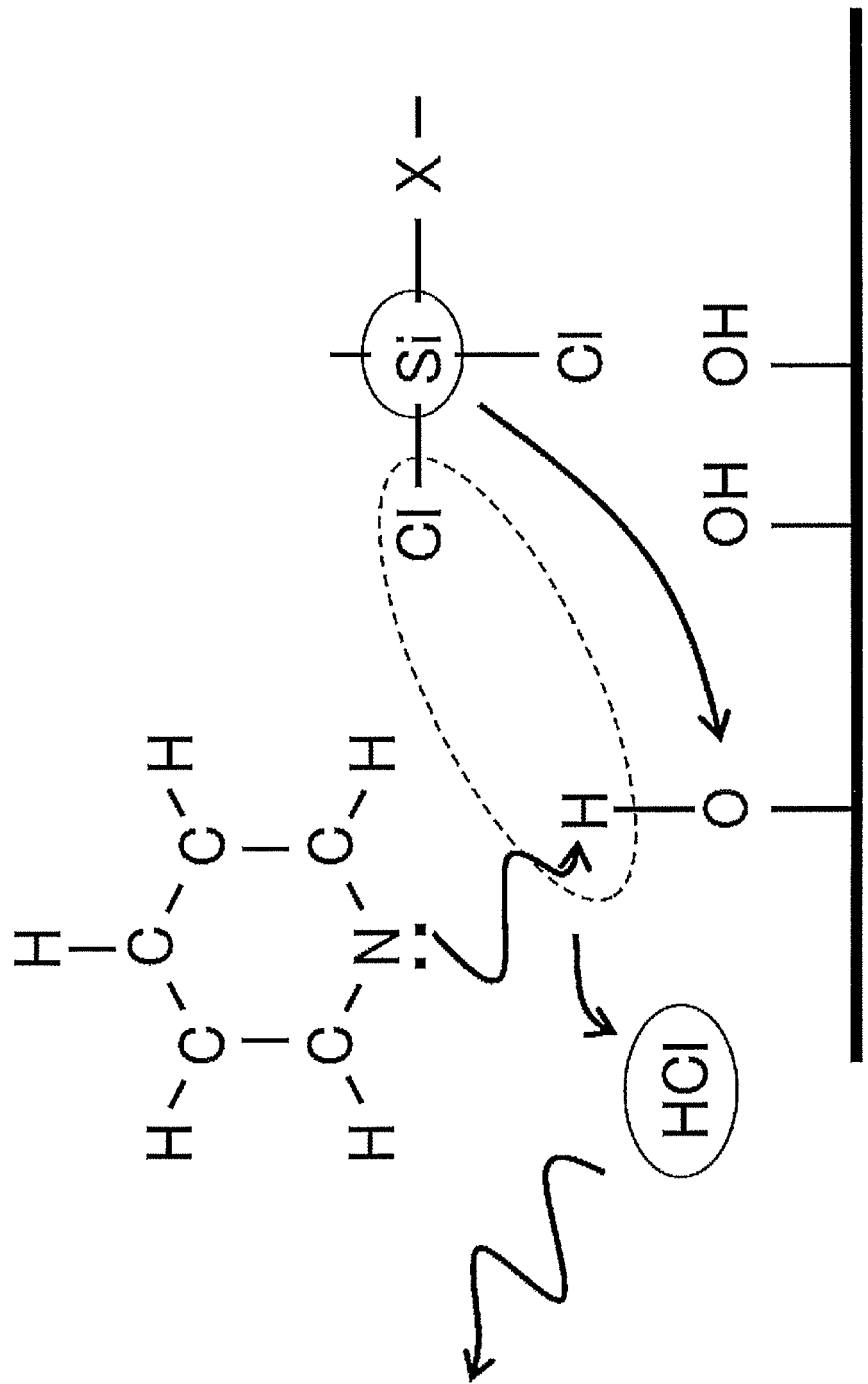
FIGS. 9A and 9B are views for explaining a catalyst reaction of the substrate processing process in accordance with the second embodiment of the present invention.
Figure 9B:
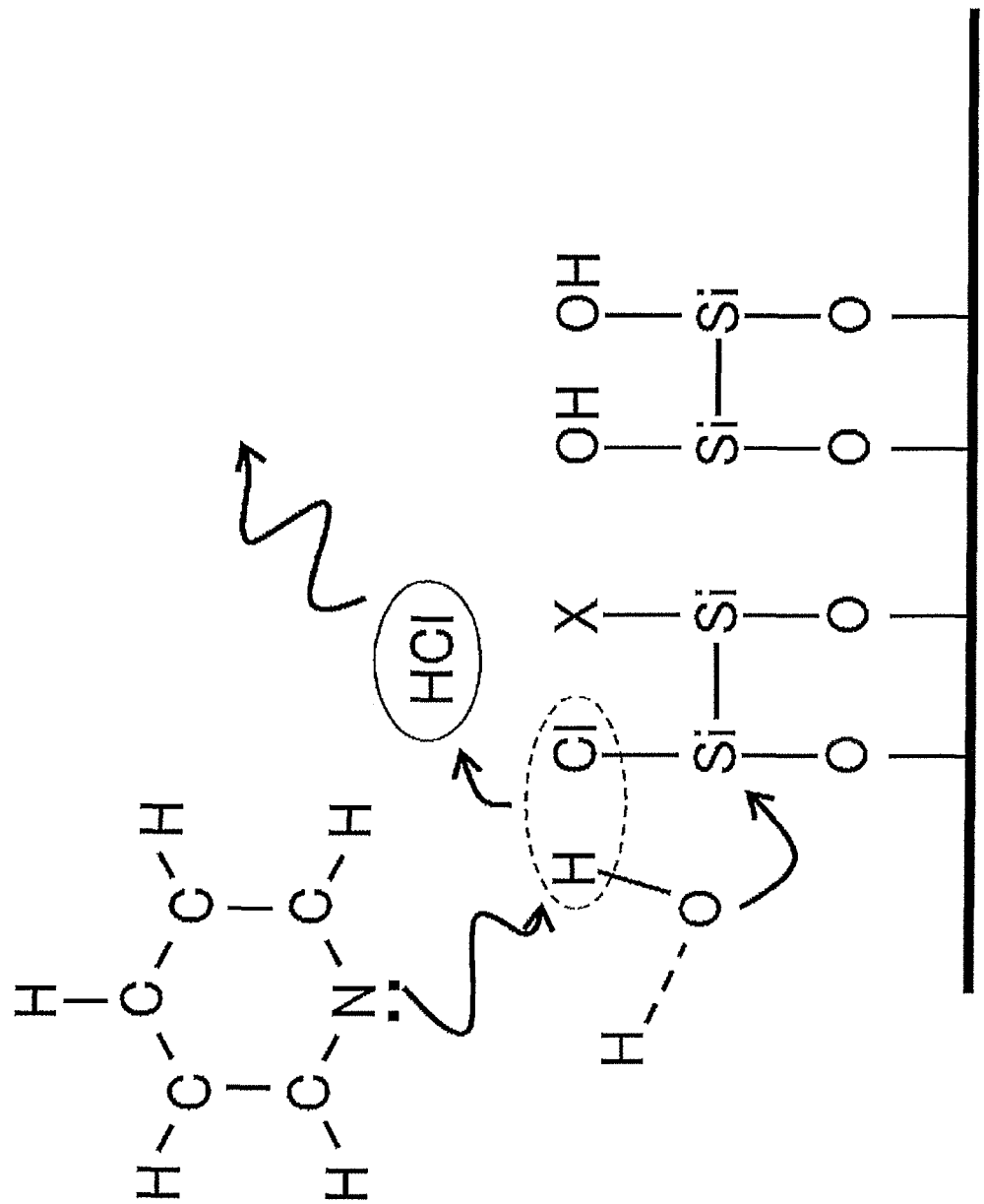

The first cycle process S204a to S204e is performed in a sequence and processing conditions similar to the first cycle process S104a to S104e in accordance with the embodiment. At this time, pyridine gas is used as a catalyst. Similar to the NH₃ gas, the pyridine gas functions to pull H (pKa=5.7) because an N atom of a pyridine molecule has a lone electron pair. Accordingly, as shown in FIGS. 9A and 9B, a bonding force of a surface of the resist lens 10 or the Si-containing layer or an O—H bond in the H₂O gas is weakened, and thus, chemisorption of the HCD gas is accelerated and surface reaction of the H₂O gas is also accelerated.

Accordingly, the SiO layer is formed on the resist lens 10 of the wafer 200 to a predetermined film thickness, for example, 2.0 Å to 1,000 Å. FIG. 8 shows an example in which the cycle is performed in times.

<Second Cycle Process S205a to S205e>

The second cycle process S205a to S205e is performed in a sequence and processing conditions similar to the second cycle process S105a to S105e in accordance with the embodiment. The pyridine gas is used as a catalyst. Accordingly, the TiO layer is formed on the SiO layer of the wafer 200 to a predetermined film thickness, for example, 2.0 Å to 1,000 Å. FIG. 8 shows an example in which the cycle is performed n times.

<Process S206 of Performing Predetermined Number of Times>

In the process S206 performed a predetermined number of times, the first cycle process S204a to S204e and the second cycle process S205a to S205e are set as one set and the set is performed with a predetermined combination (for example, m times and n times, respectively) a predetermined number of times, forming the SiTiO film on the resist lens 10 of the wafer 200 to a predetermined film thickness, for example, 2.0 Å to 2,000 Å.

Here, in this embodiment, as the deposition ratio of the TiO layer with respect to the SiO layer is gradually reduced, the SiTiO film is formed such that the refractive index is gradually reduced in a thickness direction from a surface thereof in contact with the resist lens 10 to an opposite surface in contact with air. Specifically, as the number of times the second cycle process S205a to S205e is performed with respect to the number of times the first cycle process S204a to S204e is performed, i.e., a value of n with respect to a value of m, is gradually reduced, the first cycle process S204a to S204e and the second cycle process S205a to S205e are set as one set and the set is performed a predetermined number of times. At this time, the refractive index of the SiTiO film is varied within a range of a refractive index of air to less than a refractive index of the resist lens 10.

In addition, a performing sequence of the first cycle process S204a to S204e and the second cycle process S205a to S205e is arbitrary. For example, the deposition oxide film forming process S204a to S206 may be initiated from the second cycle process S205a to S205e and may be terminated at the first cycle process S204a to S204e.

As described above, in this embodiment, the refractive index may be gradually reduced in a thickness direction from the resist lens 10 to the air and a difference in refractive index between the media may be attenuated, suppressing reflection of the resist lens 10.

<Temperature Reduction Process S208 to Substrate Unloading Process S210>

A temperature reduction process S208, a normal pressure returning process S209 and a substrate unloading process S210 are performed in a sequence similar to the corresponding processes S108 to S110 of the embodiment. From the above, the substrate processing process in accordance with the embodiment is terminated.

(2) Effects According to the Embodiment

The embodiment has the same effects as the above embodiment.

(a) In addition, according to the embodiment, the SiTiO film is formed such that the refractive index is gradually reduced in the thickness direction from the surface in contact with the resist lens 10 to the opposite surface in contact with the air. Accordingly, the difference in refractive index between the media can be further attenuated to suppress reflection of the resist lens 10.

(b) Further, according to the embodiment, the SiTiO film is formed using the pyridine, which is a catalyst. Accordingly, particles are reduced.

As described above, when the $NH_3$ gas is used as a catalyst, as the $NH_3$ gas and the HCD gas are simultaneously supplied, a reaction between the $NH_3$ gas and the HCD gas partially occurs so that $NH_4Cl$ is generated as a byproduct, generating particles (see FIG. 6A).

However, in this embodiment, since the pyridine (pKa) gas having a smaller acid dissociation constant pKa than the $NH_3$ gas and low reactivity with a group 17 element such as Cl is used as a catalyst, generation of byproducts can be suppressed and particles can be reduced.

<Third Embodiment>

Hereinafter, a substrate processing process in accordance with a third embodiment of the present invention will be described below. The substrate processing process in accordance with the embodiment is distinguished from the above embodiment in that plasma is used instead of the catalyst to activate the $H_2O$ gas, which is an oxidizing source, improving reactivity.

In the substrate processing process in accordance with the embodiment, in addition to the configuration shown in FIGS. 2 and 3, a process furnace having a mechanism configured to generate plasma is used. The mechanism mainly includes a buffer chamber, which is a gas distribution space, installed at an inner wall of the reaction tube 203, a pair of rod-shaped electrodes installed in the buffer chamber, and a radio frequency power source connected to the rod-shaped electrodes via an adapter, none of which are shown. The $H_2O$ gas, which is an oxidizing source, is supplied into the buffer chamber through a third nozzle 400c disposed in the buffer chamber and connected to a downstream end of the oxidizing source supply pipe 410c, and a high frequency power is applied to the rod-shaped electrodes from the high frequency power source via the adapter, so that the $H_2O$ gas in a plasma state is supplied into the process chamber 201.

The substrate processing process in accordance with the embodiment is performed using the process furnace including the configuration as follows. That is, in the process corresponding to the first processing source and catalyst supply process S104a, S107a and S204a or the second processing source and catalyst supply process S105a and S205a in accordance with the embodiment, chemisorption of each source is accelerated by the catalyst similar to the above embodiment, without converting the first processing source or the second material into a plasma state. In addition, in the oxidizing supply process performed in response to each of the source and catalyst supply processes, the $H_2O$ gas in a plasma state is supplied into the process chamber 201 to accelerate surface reaction by the $H_2O$ gas, without supplying the catalyst.

As described above, in this embodiment, the $H_2O$ gas in a plasma state may be supplied into the process chamber 201 to accelerate surface reaction by the $H_2O$ gas under a low temperature, even when the catalyst is not used.

<Other Embodiments>

Hereinabove, although embodiments of the present invention have been specifically described, the present invention is not limited thereto but various modifications may be made without departing from the teaching of the present invention.

For example, in the embodiments, while the photo resist is used as a lens material, in addition to a photosensitive resin such as the photo resist, a resin having plasticity or curability with respect to heat or light may be used, specifically, acryls, phenols, styrenes, etc. A refractive index of the acryls is 1.5. These resins may be transparent resins through which light having a predetermined wavelength such as visible light passes. In addition, for example, an inorganic material such as glass or quartz ($SiO_2$) may be used as a lens material.

Further, in the embodiment, while supply of the oxidizing source and supply of the first processing source or the second processing source are alternately performed, when a complex oxide film is formed, the oxidizing source may be supplied at predetermined intervals during alternate supplies of the first processing source and the second processing source a predetermined number of times.

Furthermore, in addition to the HCD gas, silicon-based chloride gases such as dichlorosilane (DCS: $SiH_2Cl_2$) gas, trichlorosilane ($SiHCl_3$) gas, tetrachlorosilane ($SiCl_4$) gas, or octachlorotrisilane ($Si_3Cl_8$) gas, fluoride gases, boromide gases, and iodide gases may be used as the Si-containing gas, which is a first element. In addition, the first element may be an element other than Si, or may include a plurality of elements.

Further, in addition to $TiCl_4$ gas, various titanium-based chloride, fluoride, boromide and iodide gases may be used as a Ti-containing gas, which is a second element. Furthermore, in addition to Ti, hafnium (Hf), zirconium (Zr), etc., may be used as the second element as long as the predetermined refractive index can be obtained when a complex oxide film is formed in combination with the first element such as Si. For example, refractive indices of a HfO layer and a ZrO layer are 2.3 and 2.2, respectively. The second element may include a plurality of elements.

In addition, in addition to the $H_2O$ gas, hydrogen peroxide ($H_2O_2$) gas, a mixed gas of hydrogen ($H_2$) gas and ozone ($O_3$) gas, mixed gas plasma of hydrogen ($H_2$) gas and oxygen ($O_2$) gas, etc., may be used as an O-containing gas, which is an oxidizing source. When the catalyst is used as in the embodiment, the gases may be used as the oxidizing source as long as the gases containing elements with different electro-negativities among molecules have electrical deviation. The $O_2$ gas or $O_3$ gas with no electrical deviation may be used when the plasma is used as in the third embodiment.

Further, in addition to the $NH_3$ gas or the pyridine gas, a gas having a relatively high pKa such as trimethylamine [$N(CH_3)_3$, pKa=9.8] gas, methylamine [$H_2N(CH_3)$, pKa=10.6] gas or triethylamine [$N(C_2H_5)_3$, pKa=10.7] gas, or a gas having a relatively low pKa similar to the pyridine gas, such as heterocycle to which N is bonded, for example, aminopyridine ($C_5H_4N$—$NH_2$, pKa=6.9), picoline [$C_5H_4N$($CH_3$), pKa=6.1], piperazine [$C_4H_{10}N_2$, pKa=5.7], lutidine [$C_5H_3N(CH_3)_2$, pKa=7.0], etc., may be used as the catalyst.

<Preferred Aspects of the Invention>

Hereinafter, preferred aspects of the present invention will be additionally stated.

An aspect of the present invention provides a method of manufacturing a semiconductor device, including:

(a) forming a lower layer oxide film on a lens formed on a substrate using a first processing source containing a first element, a second processing source containing a second element, an oxidizing source and a catalyst, the lower layer oxide film having a refractive index greater than that of air and less than that of the lens; and (b) forming an upper layer oxide film on the lower layer oxide film using the first processing source, the oxidizing source and the catalyst, the upper layer oxide film having a refractive index greater than that of the air and less than that of the lower layer oxide film.

Preferably, at least one of the process (a) and the process (b) may include heating the substrate to a temperature ranging from room temperature to 200° C.

More preferably, at least one of the process (a) and the process (b) may include heating the substrate to a temperature ranging from room temperature to 150° C.

Preferably, the first element may contain at least silicon, and the second element may contain one of at least titanium, hafnium and zirconium.

Preferably, the lens may include a transparent resin as a major material.

Preferably, the process (a) may include:

(a-1) performing one or more times a first cycle including supplying the first processing source and the catalyst into a process chamber accommodating the substrate; exhausting the process chamber; supplying the oxidizing source and the catalyst into the process chamber; and exhausting the process chamber;

(a-2) performing one or more times a second cycle including supplying the second processing source and the catalyst into the process chamber accommodating the substrate; exhausting the process chamber; supplying the oxidizing source and the catalyst into the process chamber; and exhausting the process chamber; and (a-3) performing a combination of the steps (a-1) and (a-2), and the process (b) may include: performing one or more times a third cycle including supplying the first processing source and the catalyst into the process chamber accommodating the substrate; exhausting the process chamber; supplying the oxidizing source and the catalyst into the process chamber; and exhausting the process chamber.

Another aspect of the present invention provides a semiconductor device including: a lens; a lower layer oxide film disposed on the lens, the lower layer oxide film having a refractive index greater than that of air and less than that of the lens and being formed using a first processing source containing a first element, a second processing source containing a second element, an oxidizing source and a catalyst; and an upper layer oxide film disposed on the lower layer oxide film, the upper layer oxide film having a refractive index greater than that of the air and less than that of the lower layer oxide film and being formed using the first processing source, the oxidizing source and the catalyst.

Still another aspect of the present invention provides a substrate processing apparatus including: a process chamber configured to accommodate a substrate, the substrate having a lens disposed thereon;

a heating part configured to heat the substrate;

a first processing source supply part configured to supply a first processing source containing a first element into the process chamber;

a second processing source supply part configured to supply a second processing source containing a second element into the process chamber;

an oxidizing source supply part configured to supply an oxidizing source into the process chamber;

a catalyst supply part configured to supply a catalyst into the process chamber;

an exhaust part configured to exhaust an atmosphere in the process chamber; and a control unit configured to control the heating part, the first processing source supply part, the second processing source supply part, the oxidizing source supply part, the catalyst supply part and the exhaust part to form a lower layer oxide film on the lens using the first processing source, the second processing source, the oxidizing source and the catalyst, the lower layer oxide film having a refractive index greater than that of air and less than that of the lens, and to form an upper layer oxide film on the lower layer oxide film using the first processing source, the oxidizing source and the catalyst, the upper layer oxide film having a refractive index greater than that of the air and less than that of the lower layer oxide film.

Yet another aspect of the present invention provides a method of manufacturing a semiconductor device, including: forming a deposition oxide layer on a lens formed on a substrate using a first processing source containing a first element, a second processing source containing a second element, an oxidizing source and a catalyst, the deposition oxide layer having a refractive index equal to or greater than that of air and equal to or less than of the lens, wherein, in the forming the deposition oxide layer, the deposition oxide layer is formed such that the refractive index in the deposition oxide layer is gradually reduced from a surface thereof in contact with the lens to a surface opposite to the lens and in contact with the air.

Preferably, the forming the deposition oxide layer may include: (a) performing m times a first cycle including supplying the first processing source and the catalyst into the process chamber accommodating the substrate, exhausting the atmosphere in the process chamber, supplying the oxidizing source and the catalyst into the process chamber, and exhausting the atmosphere in the process chamber; (b) performing n times a second cycle including supplying the second processing source and the catalyst into the process chamber accommodating the substrate, exhausting the atmosphere in the process chamber, supplying the oxidizing source and the catalyst into the process chamber, and exhausting the atmosphere in the process chamber; and (c) performing the steps (a) and (b) with a combination a predetermined number of times, and the deposition oxide layer is formed such that the refractive index in the deposition oxide layer is gradually reduced from a surface thereof in contact with the lens to a surface opposite to the lens and in contact with the air by gradually reducing a value of n with respect to a value of m.

Yet another embodiment of the present invention provides a semiconductor device including: a lens; and a deposition oxide film formed on the lens using a first processing source containing a first element, a second processing source containing a second element, an oxidizing source and a catalyst, wherein the deposition oxide film has a refractive index equal to or greater than that of air and equal to or less than that of the lens, and is configured such that the refractive index in the deposition oxide film is gradually reduced from a surface thereof in contact with the lens to a surface opposite to the lens and in contact with the air.

Yet another aspect of the present invention provides a substrate processing apparatus including: a process chamber configured to accommodate a substrate, the substrate having a lens disposed thereon; a heating part configured to heat the substrate; a first processing source supply part configured to supply a first processing source containing a first element into the process chamber; a second processing source supply part configured to supply a second processing source containing a second element into the process chamber; an oxidizing source supply part configured to supply an oxidizing source into the process chamber; a catalyst supply part configured to supply a catalyst into the process chamber; an exhaust part configured to exhaust an atmosphere in the process chamber; and a control unit configured to control the heating part, the first processing source supply part, the second processing source supply part, the oxidizing source supply part, the catalyst supply part, and the exhaust part to form a deposition oxide film having a refractive index equal to or greater than that of air and equal to or less than that of the lens on the lens using the first processing source, the second processing source, the oxidizing source and the catalyst, wherein the control unit controls the heating part, the first processing source supply part, the second processing source supply part, the oxidizing source supply part, the catalyst supply part, and the exhaust part such that the refractive index in the deposition oxide film is gradually reduced from a surface thereof in contact with the lens to a surface opposite to the lens and in contact with the air.

Yet another aspect of the present invention provides a method of manufacturing a semiconductor device, including: forming a lower layer oxide film on a lens formed on a substrate using a first processing source containing a first element, a second processing source containing a second element and an oxidizing source in a plasma state, the a lower layer oxide film having a refractive index greater than that of air and less than of a lens; and forming an upper layer oxide film on the lower layer oxide film using the first processing source and the oxidizing source in a plasma state, the upper layer oxide film having a refractive index greater than that of the air and less than that of the lens.

Yet another aspect of the present invention provides a method of manufacturing a semiconductor device, including: forming a deposition oxide film on a lens formed on a substrate using a first processing source containing a first element, a second processing source containing a second element, and an oxidizing source in a plasma state, the deposition oxide film having a refractive index equal to or greater than that of air and equal to or less than of the lens, wherein, in the forming the deposition oxide film, the deposition oxide film is formed such that the refractive index in the deposition oxide film is gradually reduced from a surface thereof in contact with the lens to a surface opposite to the lens and in contact with the air.

Yet another aspect of the present invention provides a semiconductor device including: a lens; and an oxide film disposed on the lens, the oxide film having a refractive index equal to or greater than that of air and equal to or less than that of the lens, wherein the oxide film is formed by depositing a silicon oxide layer; and a metal oxide layer containing one of at least titanium, hafnium and zirconium and having a refractive index greater than that of the silicon oxide layer.

Preferably, the oxide film may be configured such that the refractive index of the oxide film can be controlled by controlling a deposition ratio between the silicon oxide layer and the metal oxide layer.

Preferably, the oxide film may be configured such that the refractive index of the oxide film is gradually increased or decreased by gradually increasing or decreasing a deposition ratio of the metal oxide layer with respect to the silicon oxide layer.

Preferably, the oxide film may be formed at a temperature of 100° C. or less.

Preferably, the lens may be a lens for a CMOS image sensor installed over a light receiving element.

What is claimed is:

1. A method of manufacturing a semiconductor device, comprising forming a laminated film wherein a silicon-containing oxide film and a metal-containing oxide film are alternately stacked on a substrate by alternately performing, a predetermined number of times,
    (a) performing a first cycle a predetermined number of times, the first cycle comprising:
        supplying a silicon-containing source to the substrate; supplying an oxidizing source to the substrate; and supplying a catalyst to the substrate to form the silicon-containing oxide film; and
    (b) performing a second cycle a predetermined number of times, the second cycle comprising: supplying a metal-containing source to the substrate; supplying an oxidizing source to the substrate; and supplying a catalyst to the substrate to form the metal-containing oxide film.

2. The method according to claim 1, wherein the steps (a) and (b) are alternately performed in the step of forming the laminated film to gradually decrease a stacking ratio of the metal-containing oxide film with respect to the silicon-containing oxide film.

3. The method according to claim 1, wherein the silicon-containing source comprises at least one selected from a group consisting of chloride, fluoride, bromide and iodide.

4. The method according to claim 1, wherein the silicon-containing source comprises at least one selected from a group consisting of hexachlorodisilane, dichlorosilane, trichlorosilane, tetrachlorosilane and octachlorotrisilane.

5. The method according to claim 1, wherein the metal-containing source comprises at least one selected from a group consisting of chloride, fluoride, bromide and iodide.

6. The method according to claim 1, wherein the oxidizing source comprises at least one selected from a group consisting of $H_2O$, $H_2O_2$, a mixed gas of $H_2$ and $O_3$ and a mixed gas of $H_2$ and $O_2$.

7. The method according to claim 1, wherein the catalyst comprises at least one selected from a group consisting of ammonia, pyridine, trimethylamine, methylamine, triethylamine, aminopyridine, picoline, piperazine and lutidine.

8. The method according to claim 1, wherein the metal-containing source comprises at least one selected from a group consisting of titanium, hafnium, and zirconium.

9. The method according to claim 1, wherein the substrate is heated to a temperature ranging from room temperature to 200° C. in at least one of the steps (a) and (b).

10. The method according to claim 1, wherein the substrate is heated to a temperature ranging from room temperature to 150° C. in at least one of the steps (a) and (b).

11. A method of manufacturing a semiconductor device, comprising:
    (a) forming a laminated film wherein a silicon-containing oxide film and a metal-containing oxide film are alternately stacked on a substrate by alternately performing, a predetermined number of times, (a-1) performing a first cycle a predetermined number of times, the first cycle comprising: supplying a silicon-containing source to the substrate; supplying an oxidizing source to the substrate; and supplying a catalyst to the substrate to form the silicon-containing oxide film; and (a-2) performing a second cycle a predetermined number of times, the second cycle comprising: supplying a metal-containing source to the substrate; supplying an oxidizing source to the substrate; and supplying a catalyst to the substrate to form the metal-containing oxide film; and
    (b) forming a silicon-containing oxide film on the laminated film by performing a third cycle a predetermined number of times, the third cycle comprising: supplying a silicon-55 containing source to the substrate; supplying an oxidizing source to the substrate; and supplying a catalyst to the substrate.

* * * * *